(12) United States Patent
Bringuier

(10) Patent No.: US 10,446,933 B1
(45) Date of Patent: Oct. 15, 2019

(54) MAGNETIC ANTENNA STRUCTURES HAVING IMPROVED GAIN BANDWIDTH PERFORMANCE

(71) Applicant: General Atomics, San Diego, CA (US)

(72) Inventor: Jonathan Neil Bringuier, Carlsbad, CA (US)

(73) Assignee: General Atomics, San Diego, CA (US)

( * ) Notice: Subject to any disclaimer, the term of this patent is extended or adjusted under 35 U.S.C. 154(b) by 0 days.

(21) Appl. No.: 15/904,822

(22) Filed: Feb. 26, 2018

(51) Int. Cl.
| | | |
|---|---|---|
| *H01Q 1/00* | (2006.01) |
| *H01Q 7/08* | (2006.01) |
| *H01Q 1/36* | (2006.01) |
| *B23P 19/04* | (2006.01) |
| *G01R 33/09* | (2006.01) |
| *H03C 7/02* | (2006.01) |
| *H01Q 1/12* | (2006.01) |
| *H01Q 7/06* | (2006.01) |
| *H01Q 13/24* | (2006.01) |

(52) U.S. Cl.
CPC ............ *H01Q 7/08* (2013.01); *B23P 19/04* (2013.01); *G01R 33/09* (2013.01); *H01Q 1/12* (2013.01); *H01Q 1/36* (2013.01); *H03C 7/022* (2013.01); *H01Q 7/06* (2013.01); *H01Q 13/24* (2013.01)

(58) Field of Classification Search
CPC ............. H01Q 7/06; H01Q 7/08; H01Q 13/24
USPC .................................................. 343/787, 788
See application file for complete search history.

(56) References Cited

U.S. PATENT DOCUMENTS

| | | | |
|---|---|---|---|
| 8,686,918 B1 | 4/2014 | Diaz | |
| 8,773,312 B1 * | 7/2014 | Diaz | ........................ H01Q 1/38 343/700 MS |
| 8,847,840 B1 | 9/2014 | Diaz | |
| 8,847,846 B1 | 9/2014 | Diaz | |
| 2009/0315680 A1 * | 12/2009 | Arimura | .......... G06K 19/07749 340/10.1 |

* cited by examiner

*Primary Examiner* — Binh B Tran
(74) *Attorney, Agent, or Firm* — Perkins Coie LLP

(57) ABSTRACT

Magnetic antenna techniques and devices are disclosed for operating at an RF or microwave frequency by using a magnetic antenna structure that is configured to have a spatially varying property that varies spatially from one location to another location in at least a portion of the magnetic antenna structure. Such a spatial varying property can be reflected in various ways, e.g., a resonator located in part of the magnetic antenna structure, or a spatially varying geometry profile in part of or the entirety of the magnetic antenna structure.

36 Claims, 22 Drawing Sheets

MAGNETIC ANTENNA STRUCTURES HAVING IMPROVED GAIN BANDWIDTH PERFORMANCE

TECHNICAL FIELD

This patent document relates generally to antennas for transmitting or receiving electromagnetic energy or signals in various applications including wireless communications.

BACKGROUND

An antenna used in many radar systems, radio or communication devices is typically an electrically conductive device made of one or more electrically conductive materials and interfaces with a circuit and a medium surrounding the antenna, such as air or other dielectric medium, to either transmit an electromagnetic wave from the circuit into the medium or to receive an electromagnetic wave from the medium into the circuit. In transmitting the electromagnetic wave from the circuit into the medium, the circuit operates to generate an alternating current distribution at one or more alternating radio frequencies in the antenna which in turn radiates an electromagnetic wave at the one or more radio frequencies into the medium. In receiving an electromagnetic wave from the medium into the circuit, the antenna interfaces with the incoming electromagnetic wave at one or more radio frequencies to produce an alternating current distribution at one or more alternating radio frequencies in the antenna which are received by the circuit. In both transmitting and receiving operations, the conventional antenna transduces power between the free space electromagnetic wave and a guided wave on a transmission line connected to the antenna. An antenna can generally radiate and receive electromagnetic waves over a range of frequencies also known as the bandwidth of the antenna. An antenna's performance such as the antenna's bandwidth, gain, or efficiency can depend on several antenna design considerations such as the shape, size, or materials used to construct the antenna.

SUMMARY

Examples of antenna techniques and devices are disclosed for operating at an RF or microwave frequency by using a magnetic antenna structure that is configured to have a spatially varying property that varies spatially from one location to another location in at least a portion of the magnetic antenna structure. Such a spatial varying property can be reflected in various ways, e.g., a resonator located in part of the magnetic antenna structure, or a spatially varying geometry profile in part of or the entirety of the magnetic antenna structure. Such spatially varying magnetic antenna structures may be used to achieve certain advantages in specific antenna applications, including, e.g., enhancing an efficiency in transmitting or receiving a radio frequency or microwave signal at least at frequencies where the magnetic polarizability beings to degrade, or extend frequencies of operation with improved gain and receiver sensitivity.

In one aspect, the disclosed technology can be used to provide a magnetic antenna device which includes a magnetic antenna structure that is ferromagnetic and interacts with a radio frequency or microwave signal to receive and concentrate a magnetic field of the radio frequency or microwave signal locally in or near the magnetic antenna structure. The magnetic antenna structure is configured to include different antenna segments arranged lengthwise along a length of the magnetic antenna structure. This magnetic antenna device includes a resonator located at or near a region between the antenna segments and coupled to exchange magnetic energy with the magnetic structure. The resonator is structured to be in resonance with one or more modes of the magnetic field. The device also includes an antenna circuit communicatively coupled to the magnetic antenna structure to receive an antenna signal from the magnetic antenna structure associated with the received and concentrated magnetic field of the radio frequency or microwave signal locally in or near the magnetic antenna structure and to supply an output antenna signal to the magnetic antenna structure for transmission. In some implementations, each antenna segment may have a spatially uniform profile along the segment. In addition, in some other implementations, an antenna segment at or near the resonator may include a tapered region that varies spatially from one location to another location at one end of the antenna segment. In other designs, an antenna segment also has a tapered region located across from another tapered region of another antenna segment.

The above and other aspects, and associated implementations are described in greater detail in the description, the drawings and the claims.

BRIEF DESCRIPTION OF THE DRAWINGS

Like reference numeral refer to similar features.

DETAILED DESCRIPTION

Figure 1:
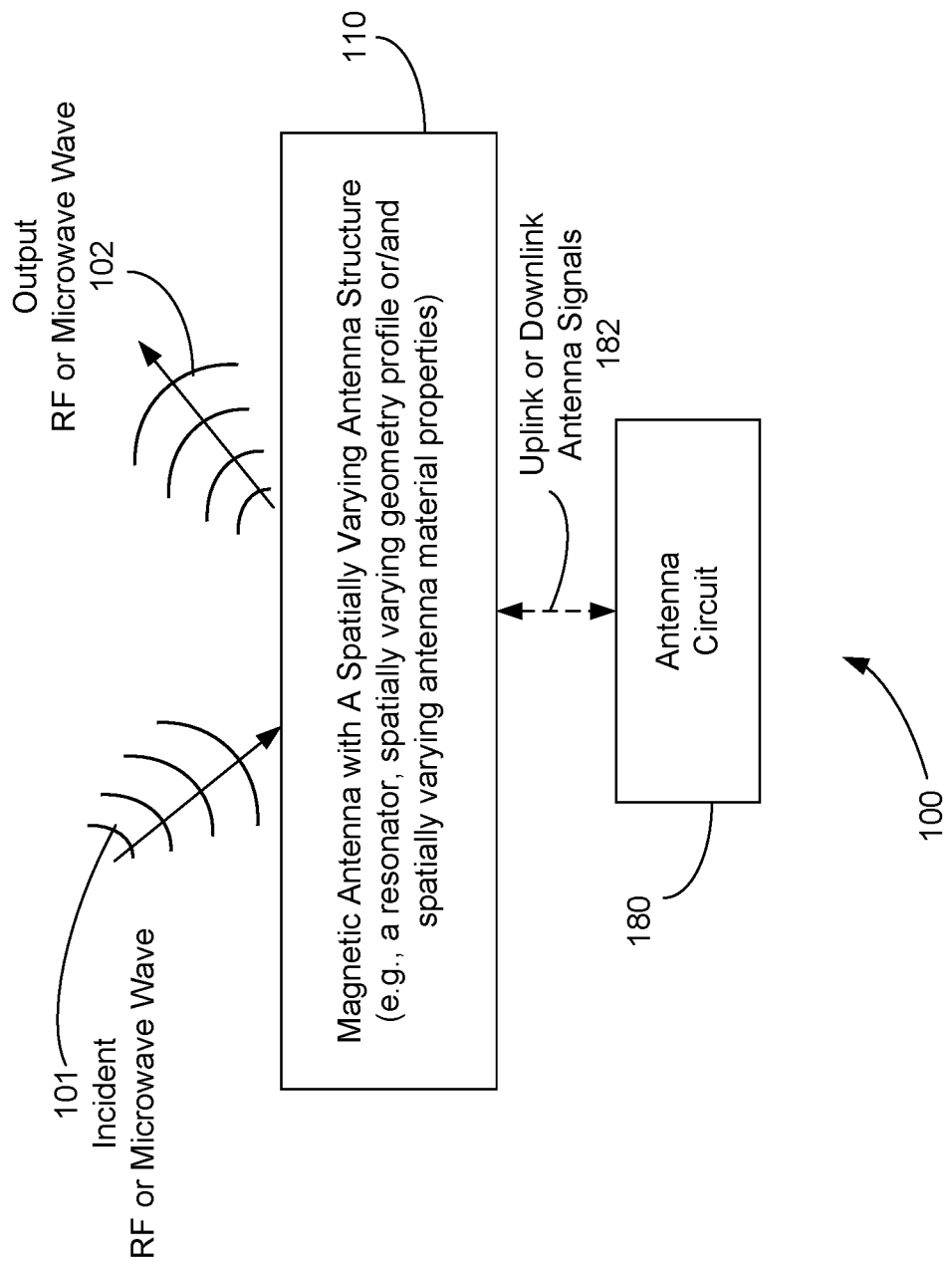
FIG. 1 shows an example of a magnetic antenna device that implements the disclosed technology using a spatial varying property in the magnetic antenna structure.

Magnetic antenna designs disclosed in this patent document explore certain unique features in magnetic antennas to use some spatially varying properties from one location to another location in at least a portion of the magnetic antenna structure to gain certain device design, fabrication or operational advantages. For example, a magnetic antenna disclosed in this document, in the antenna receiving operation, first localizes a magnetic field in an incoming antenna signal to concentrate the magnetic flux at one or more locations and then converts a concentrated magnetic field at a location into an RF or microwave signal for the receiver operation. This aspect is different from an antenna based on conventional electrically conductive materials such as metals and allows more flexibility in the spatial distribution of the magnetic antenna geometry or spatial distribution of the material property of the magnetic antenna.

While magnetic materials can provide improved gain-bandwidth product performance for some antennas, various magnetic materials that can realize such an improved performance have frequency roll-off degradations of the effective permeability. Thus, such magnetic materials exhibiting frequency roll-off degradations may not be able to provide wideband operations efficiently. Furthermore, certain magnetic materials exhibit parameter degradation in frequency bands of interest for wireless communications, e.g., HF, UHF, or VHF.

The technology disclosed in this patent document can be implemented by using a magnetic antenna structure that is configured to have a spatially varying property that varies spatially from one location to another location in at least a portion of the magnetic antenna structure to improve the antenna performance. Such a spatial varying property can be reflected in various ways, e.g., placing a resonator in part of the magnetic antenna structure, or a spatially varying geometry profile in part of or the entirety of the magnetic antenna structure. Such spatially varying magnetic antenna structures may be used to achieve certain advantages in specific antenna applications, including, e.g., enhancing an efficiency in transmitting or receiving a radio frequency or microwave signal at least at frequencies where the magnetic polarizability beings to degrade, or extend frequencies of operation with improved gain and receiver sensitivity. In some designs based on the disclosed technology, a magnetic antenna device may place a magnetic field resonator in a magnetic antenna to concentrate the magnetic energy at or near the magnetic field resonator in part via the resonance of the resonator to enhance the radiation efficiency and sensitivity performance of such a magnetic antenna device. For example, a magnetic field resonator may be placed in an area that includes a gap between two different magnetic antenna segments so that the magnetic field can be enhanced at or near the resonator. The different magnetic antenna segments in the magnetic antenna may be shaped in various geometries or shapes to meet specific needs of such devices. For example, some device designs may use magnetic antenna segments with substantially uniform cross sections in the magnetic antenna. In other designs based on the disclosed technology, for example, a magnetic antenna device may be structured to combine a magnetic antenna having a spatially varying antenna profile (e.g., a tapered segment) to increase the magnetic field at a location and a magnetic field resonator to further concentrate the magnetic energy in part via the resonance of the resonator to enhance the radiation efficiency and sensitivity performance. In implementations, the structure of such a magnetic antenna can be configured to maintain desired antenna performance over a frequency range including the frequencies where magnetic polarizability begins to degrade in absence of the disclosed resonator. In the specific examples disclosed below, the resonator is located at or near the magnetic antenna and is coupled to exchange magnetic energy with the magnetic antenna. The resonator is structured to be in resonance with one or more modes of the magnetic field. The resonator can have a minimal effect on the operation of the magnetic antenna below the characteristic modal cutoff frequency of the antenna. Thus, one of the benefits of the exemplary resonator is that it can extend the frequencies of operation with improved realized gain and receiver sensitivity. Another benefit of the magnetic antenna with the exemplary resonator is that the gain-bandwidth product performance of such an antenna can be improved.

The examples disclosed below use a spatially varying antenna property to provide various spatially varying design parameters to achieve one or more advantages or benefits that are additional to or associated with certain advantages that can be achieved in magnetic antennas, including high antenna efficiency, wideband operations that include at least the frequencies where the magnetic material beings to degrade, compact sizing, conformal configurations over support bases, lightweight, and others. For example, spatially varying magnetic antenna structures may be used to achieve one or more advantages in specific antenna applications, including enhancing an efficiency in transmitting or receiving a radio frequency or microwave signal at least at frequencies where the magnetic polarizability begins to degrade, or extend frequencies of operation with improved gain and receiver sensitivity.

A suitable spatially varying magnetic antenna structure based on the disclosed technology can be designed to manage the flow of the magnetic flux density, B, through the magnetic material during operation, and, in some cases, may be used to optimize one or more aspects of a magnetic antenna device for a particular need or performance feature in an application. In some implementations, a spatially varying magnetic antenna structure can include different antenna segments in which an antenna segment at or near a magnetic field resonator may include a tapered region that varies spatially from one location to another location at one end of the antenna segment where the resonator is located. Furthermore, in some designs, an antenna segment of such a device may also be designed to additionally include a tapered region located across from another tapered region of another antenna segment.

FIG. 1 shows an example of a magnetic antenna device that implements the disclosed technology using a spatial varying property in the magnetic antenna structure. In this example, the magnetic antenna device 100 includes a magnetic antenna structure 110 and an antenna circuit 180 that is coupled to and operates the magnetic antenna structure 110. The magnetic antenna structure 110 is ferromagnetic and has a ferromagnetic magnetization that can be modified or influenced by a magnetic field applied to or incident to the magnetic antenna structure 110. For example, the magnetic antenna structure 110 can interact with an incident radio frequency or microwave signal 101 to receive and concentrate a magnetic field of the radio frequency or microwave signal 101 locally in or near the magnetic antenna structure 110. Notably, the magnetic antenna structure 110 is configured to have a spatial varying property that varies spatially from one location to another location in at least a portion of the magnetic antenna structure 110. In some embodiments, the spatially varying property includes a resonator located in part of the magnetic antenna structure. The antenna circuit 180 is communicatively coupled to the magnetic antenna structure 110 to receive an antenna signal 182 (a downlink signal) from the magnetic antenna structure 110 associated with the received and concentrated magnetic field of the radio frequency or microwave signal 101 locally in or near the magnetic antenna structure and to supply an output antenna signal 182 (an uplink signal) to the magnetic antenna structure for transmission as the output RF or microwave signal 102.

The magnetic material for this antenna 110 can be implemented in various forms, e.g. by using a composite magnetic material structure with different parts or/and materials that are engineered to achieve certain desired material properties based on the requirements of particular antenna applications. The magnetic material for this antenna 110 can include magnetodielectric materials.

In some implementations, the magnetic antenna 110 in FIG. 1 can be structured to exhibit a relatively high magnetic permeability $\mu$. The magnetic permeability $\mu$ includes two parts: the imaginary permeability $\mu''$ and the real permeability A material with a small imaginary permeability $\mu''$ tends to improve the antenna efficiency. A suitable ferromagnetic material structure for the antenna 110 may be configured to have different properties of its magnetic permeability $\mu$. For example, in some applications, the real permeability ($\mu'$) may be less than the imaginary permeability ($\mu''$). In other applications, possibly in many applications, the real permeability ($\mu'$) may be greater than the imaginary permeability ($\mu''$). Under this regime for $\mu' > \mu''$, the composite antenna structure 110 may also have its real permittivity ($\varepsilon'$) greater than its imaginary permittivity ($\varepsilon''$). In some applications, the real part of the electromagnetic constitutive property can be significantly greater than a corresponding imaginary part of the electromagnetic constitutive property. For example, the real part of the electromagnetic constitutive properties may be three, five, tens or even hundreds of times greater than the corresponding imaginary electromagnetic constitutive property. The higher real part of electromagnetic constitutive property may be used advantageously to reduce the cross section dimension of the structure. For material compositions for the structure to have the real part of the electromagnetic constitutive property to be greater than a corresponding imaginary part of the electromagnetic constitutive property (e.g., real permittivity ($\varepsilon'$)>imaginary permittivity ($\varepsilon''$); or real permeability ($\mu'$)>imaginary permeability ($\mu''$)), such a material may be referred to as a pseudo-conductor material as described in U.S. Pat. Nos. 8,773,312 B1; 8,847,840 B1; 8,847,846 B1 and 8,686,918 B1 that are granted to Rodolfo E. Diaz and are assigned to General Atomics. The above-referenced four U.S. patents are incorporated by reference as part of this patent document.

In other implementations, the magnetic antenna 110 in FIG. 1 may be engineered to achieve a high bandwidth operation by increasing the ratio of the permeability to the permittivity. In this regard, various permeable materials, such as many commercially available magnetic materials, tend to be heavy, fragile ceramic ferrites with limited frequency capabilities. For example, Manganese ferrites ($\mu$! in the 1000's) can be utilized for some implementations in the KHz to low MHz range, Nickel Zinc ferrites ($\mu$! in the 100's) may provide permeabilities in the VHF range; while approaching 1 GHz, hexaferrites (e.g. $Co_2Z$) have sizeable permeabilities in the 10 to 30 range, but often become less efficient from the high UHF and up. Since many ferrite ceramics have a permittivity of the order of 10, this means that as the GHz range is approached the highest WE ratio attained by a ferrite is of the order of 3:1 ($\varepsilon \sim 3$) by aligned $Co_2Z$. As such, many of these materials, such as natural ferrites, suffer from naturally limited efficiency bandwidths usually associated with broad loss peaks that introduce excess unwanted loss. Materials can be engineered to have $\mu' \gg \varepsilon'$ to provide wider efficiency bandwidth operations. For example, such a device can be configured to detect signals from DC to L-band and do so without requiring a special tuning circuit (for example) to efficiently receive in the frequency band of interest. In implementing the disclosed antenna devices, a single magneto-optical magnetic antenna can cover a frequency range that would require multiple electrical antennas.

Figure 2A:
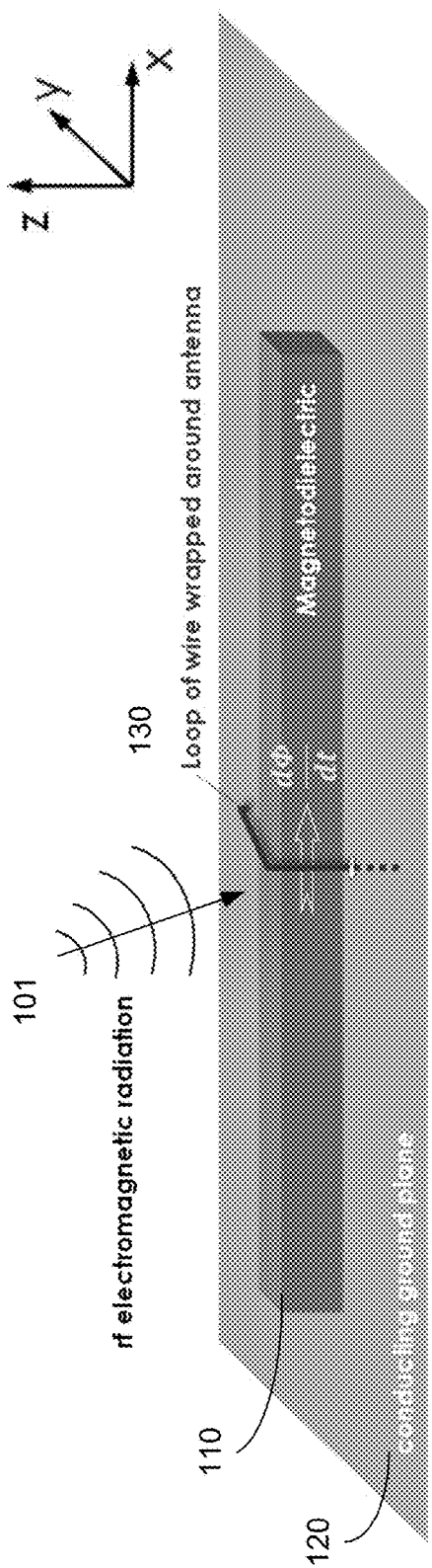
FIGS. 2A and 2B show an example of a conformal configuration of a magnetic antenna device over an electrically conducting ground plane that can be used for implementing the device design in FIG. 1.
Figure 2B:
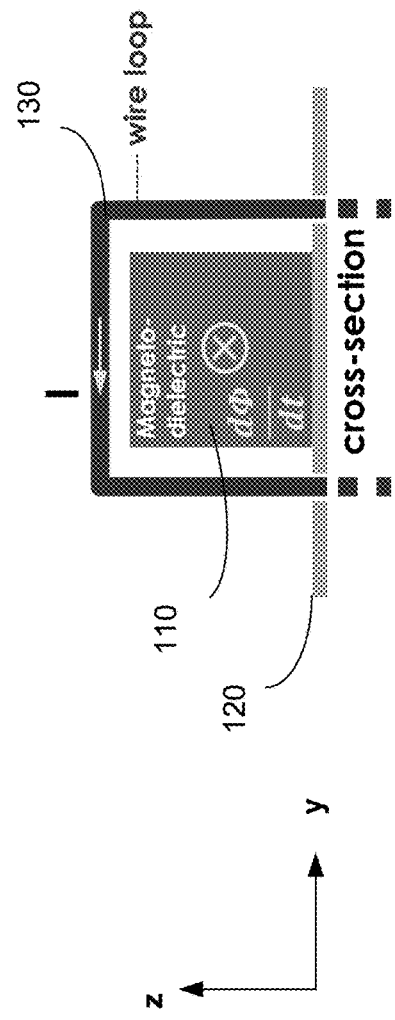

In connection with the magnetic antenna 110 in FIG. 1, FIGS. 2A and 2B show an example of a magnetic antenna in a conformal configuration over an electrically conducting surface such as a metal plate or base. In the xyz coordinates shown, the conducting ground plane 120 lies in the xy-plane and the antenna 110 is elongated along the x direction. This configuration can be used for implementing the device design in FIG. 1. In the illustrated magnetic antenna in FIGS. 2A and 2B, the ferromagnetic material structure (e.g., a magnetodielectric material) for the antenna 110 is used as the entire or part of the composite antenna structure for the antenna 110 and is placed over an electrically conducting plane 120 such as a surface of a metal structure and a metal conductor loop 130 is provided to surround a portion of the ferromagnetic material structure for the antenna 110.

Figure 3:
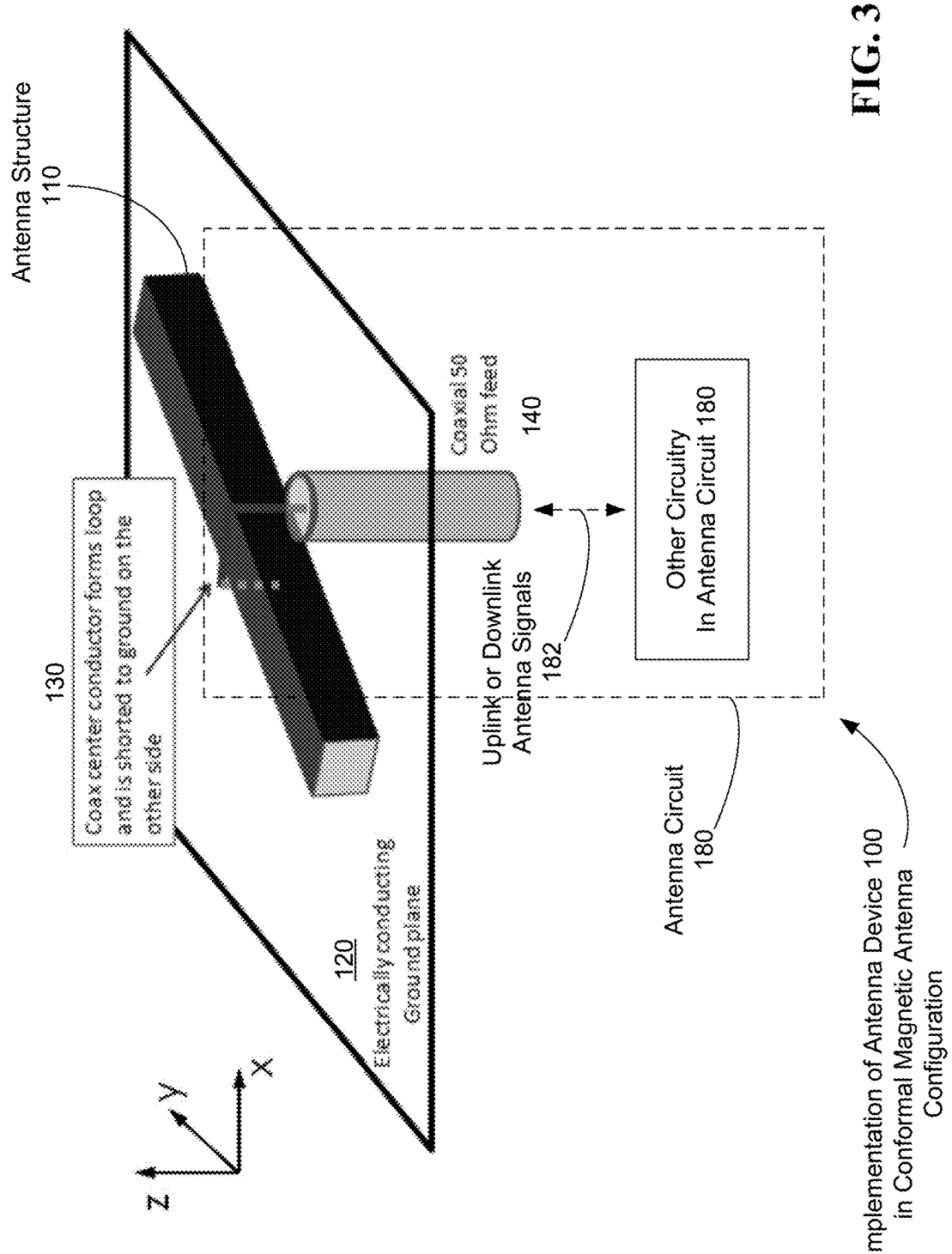
FIG. 3 further shows an example for using a coaxial feed line as part of the antenna circuit when implementing the device design in FIG. 1.

FIG. 3 further shows an example in which a coaxial feed line 140 is provided for sending an antenna signal in form of a current into the loop 130 or for receiving the generated current by the loop 130 as part of the antenna circuit 180 when implementing the device design in FIG. 1. The magnetic antenna 110 can convert an oscillating current in the metal conductor loop 130 from an antenna transmission circuitry via the coaxial feed line 140 into an oscillating magnetic field in the ferromagnetic material of the antenna 110 that would radiate as an output RF or microwave signal. In addition, this structure allows the ferromagnetic material of the antenna 110 to capture and concentrate the magnetic field of the incident electromagnetic signal and converts the captured and concentrated magnetic field into a current in the loop 130 in a receiver operation. Notably, in FIGS. 2A, 2B and 3, the ferromagnetic material structure for the antenna 110 has a conformal configuration with respect to the conducting plane 120 and such a conformal configuration is beneficial or desirable in various applications. This conformal antenna configuration on a conducting structure is difficult to implement with other antennas using electrically conductive materials such as metals. In implementations, the ferromagnetic material structure for the antenna 110 (including its conformal configuration) may be used in various disclosed antenna devices to concentrate the magnetic flux of the received signal.

Figure 4:
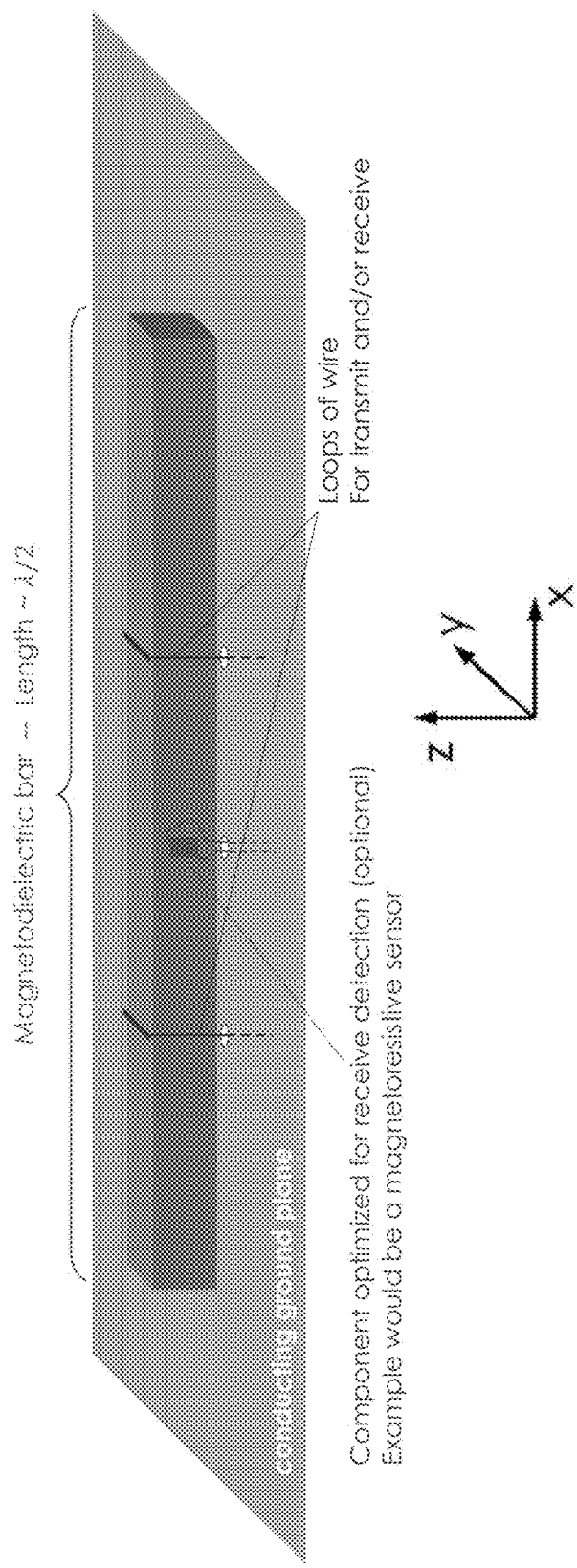
FIG. 4 shows an example of a magnetic antenna device with antenna transmission and reception circuits.

FIG. 4 shows an example of a bar-shaped magnetic antenna that uses the conformal configurations as in FIGS. 2A, 2B and 3. The magnetodielectric structure is fashioned into a bar shape that efficiently couples to the electromagnetic modes of interest and may, for example, be a length of about one half of the electromagnetic wavelength of an RF or microwave signal. This particular example uses a conductive wire loop at a position along the bar-shaped magnetic antenna to wrap around the bar that typically have a shared use for both transmitting and receiving signals. In some implementations, the transmit and receive componentry can be decoupled so that each can be individually optimized for its specific role, for example, one loop configured and optimized for transmitting an outgoing RF or microwave signal and another loop configured and optimized for receiving an incoming RF or microwave signal.

As shown in FIG. 4, a conductive wire loop can be used as a designated receiver detector while the antenna receive detector is a completely separate, designated detector that includes magnetoresistive (MR) sensor. The MR sensor can be located inside or near the bar-shaped magnetic antenna to either magnetically couple to the magnetization of the bar-shaped magnetic antenna (e.g., via magnetic exchange coupling) or reside in the magnetic field of the received RF or microwave signal so that the MR sensor can sense a magnetic field of the electromagnetic field caused by the received radio frequency or microwave signal based on the MR effect and an associated variable resistance of the MR sensor. This MR sensing produces an MR sensor signal that carries information in the received radio frequency or microwave signal.

The spatial geometry and/or size, of the magnetic antenna can be designed to vary spatially at different locations in one or more selected sections of, or the entirety of, the magnetic antenna to improve the antenna performance. Examples of such magnetic antenna designs are provided below to encompass magnetodielectric structures with patch resonators and variable cross-sectional areas.

Figure 5:
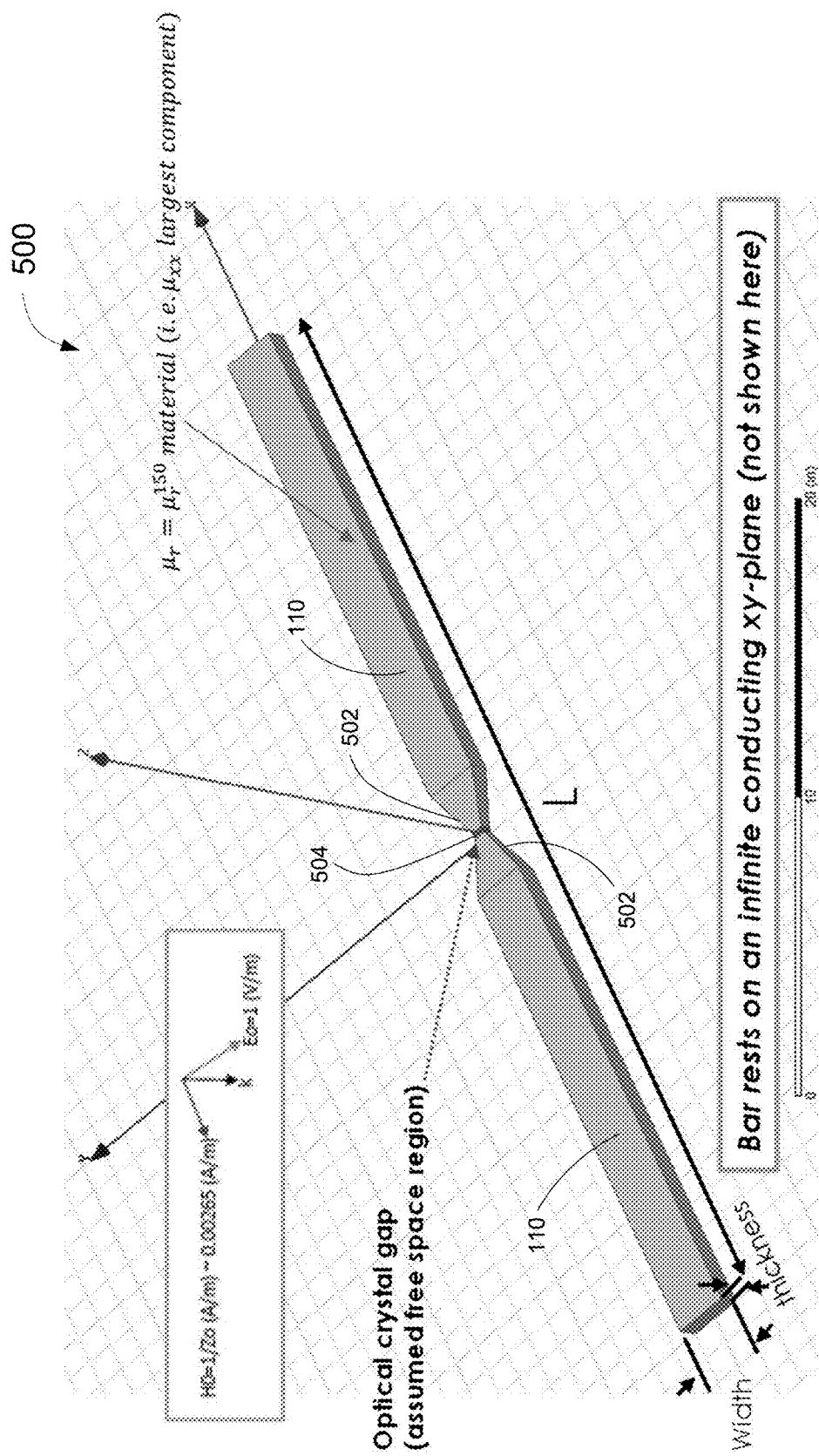
FIG. 5 shows an example of a spatially varying property in a magnetic antenna structure.

FIG. 5 shows an example of a spatially varying property in a magnetic antenna structure 500 that uses at least some of the conformal configurations as in FIGS. 2A, 2B, 3, and 4. The spatially varying property of the magnetic antenna structure can include at least two bar shaped antenna segments 110. In some embodiments, each bar shaped antenna segment 110 can include a spatially varying geometry, such as a tapered or narrowed section 502 near one end of the bar shaped antenna segment 110. In some other embodiments, each bar shaped antenna segment 100 may not include a tapered or narrowed section, as shown in FIG. 12D. As shown in FIG. 5, the two antenna segments 110 are arranged lengthwise along the length of the magnetic antenna structure in the x direction. The tapered or narrow section 520 of one bar shaped antenna segment can be located across from the tapered or narrow section 520 of another bar shaped antenna segment. In some embodiments, the tapered or narrowed section 502 allows the at least two antenna segments 110 to locally concentrate the magnetic flux density in or around the tapered region. In some other embodiments, as shown in FIG. 12D, two bar shaped antenna segments located across from each other without a tapered or narrowed section can locally concentrate the magnetic flux density in or around an area that includes a region in between the two bars that includes the free space region 504 in FIG. 5. In some applications, such as a pickup loop for induced electromotive force, antenna segments with non-tapered bar can maximize the total flux and the receive voltage.

In some implementations, a magneto-optical (MO) crystal or a Faraday material can be located in the free space region 504 between the two bar shaped antenna segments 110. In such implementations, the tapered or narrow section 502 of the bar shaped antenna segments 110 maximizes flux concentration in the gap region 504 that may include a MO crystal. In some other implementations, the gap region 504 may include a material that may exhibit sensitivity to static or time-varying magnetic fields. In some implementations, the relative permeability of the materials included in the two bar shaped antenna segments 110 can be 150. In some implementations, the length L of the magnetic antenna structure can be 40 inches, the width of the magnetic structure or each antenna segments can be 2 inches, and the thickness of the magnetic structure or each antenna segments can be 0.8 inches.

Figure 6:
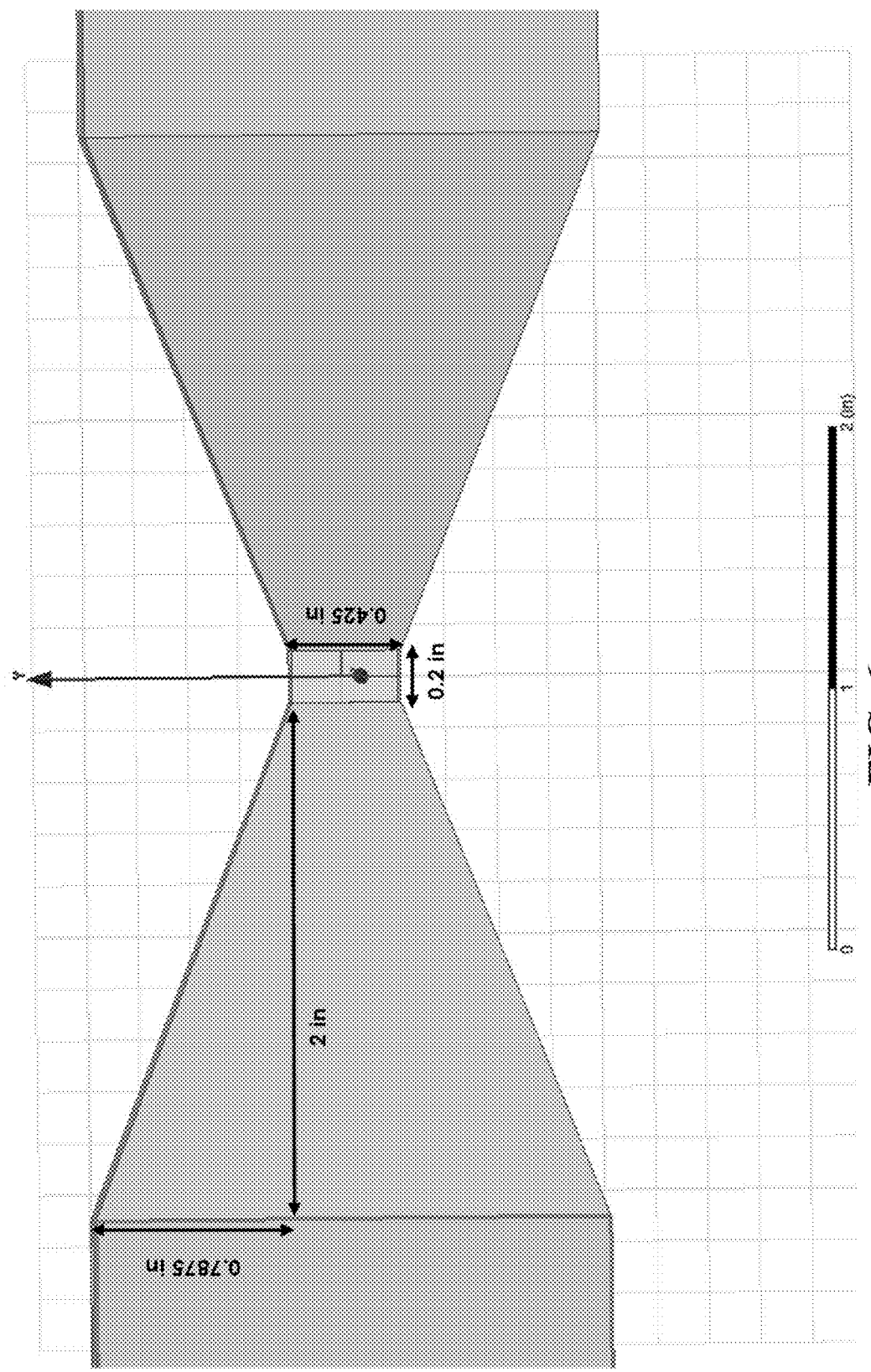
FIG. 6 shows a top view of a part of the magnetic antenna structure of FIG. 5.
Figure 7:
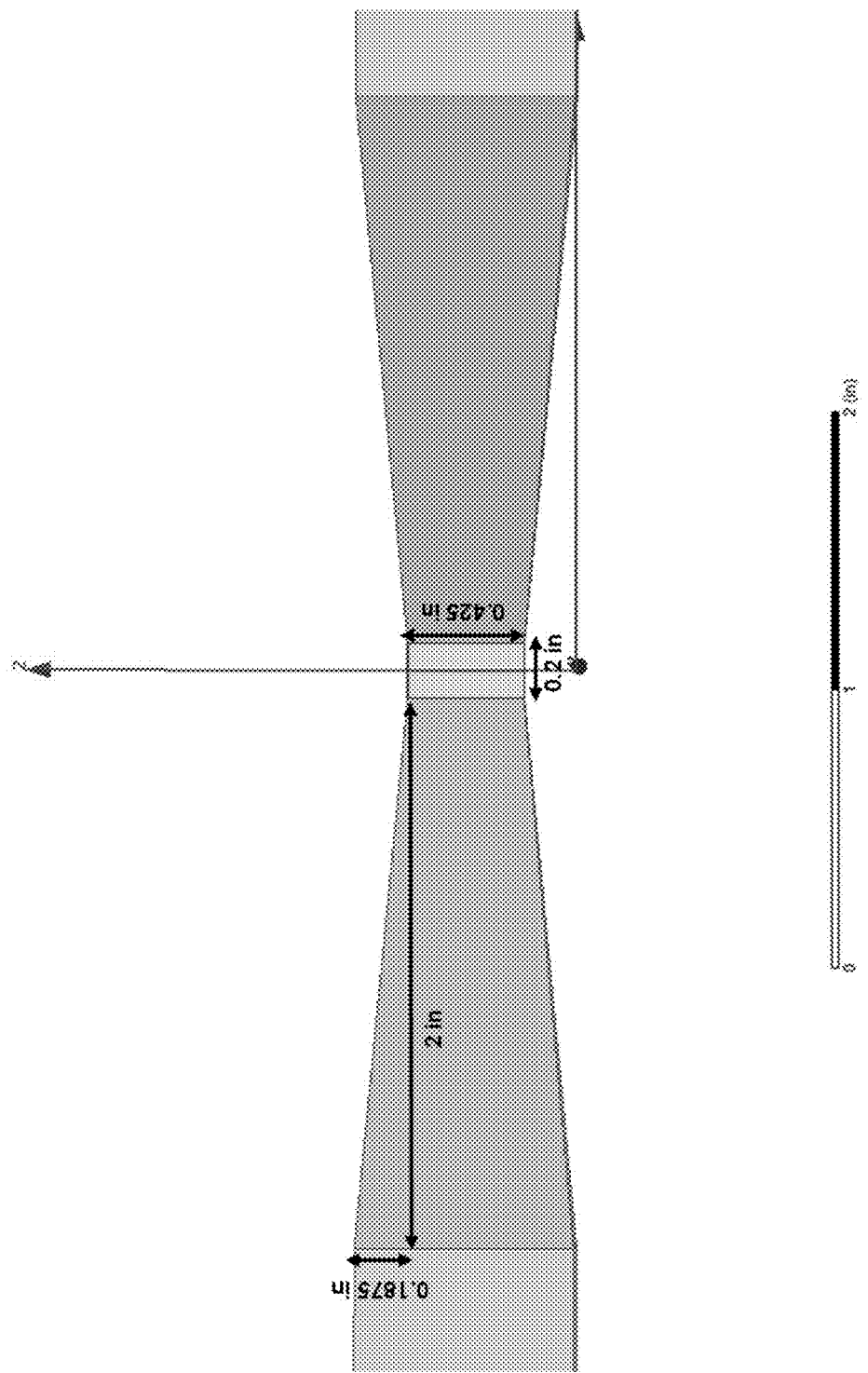
FIG. 7 shows a side view of a part of the magnetic antenna structure of FIG. 5.

FIGS. 6 and 7 show a top view and a side view, respectively, of a part of the magnetic antenna structure of FIG. 5. FIGS. 6 and 7 also include exemplary dimensions for the magnetic antenna structure in the area surrounding the gap region. The exemplary dimensions show that the two magnetic antenna structures have a tapered or narrowed section with a gap region that may include a MO crystal.

Figure 8A:
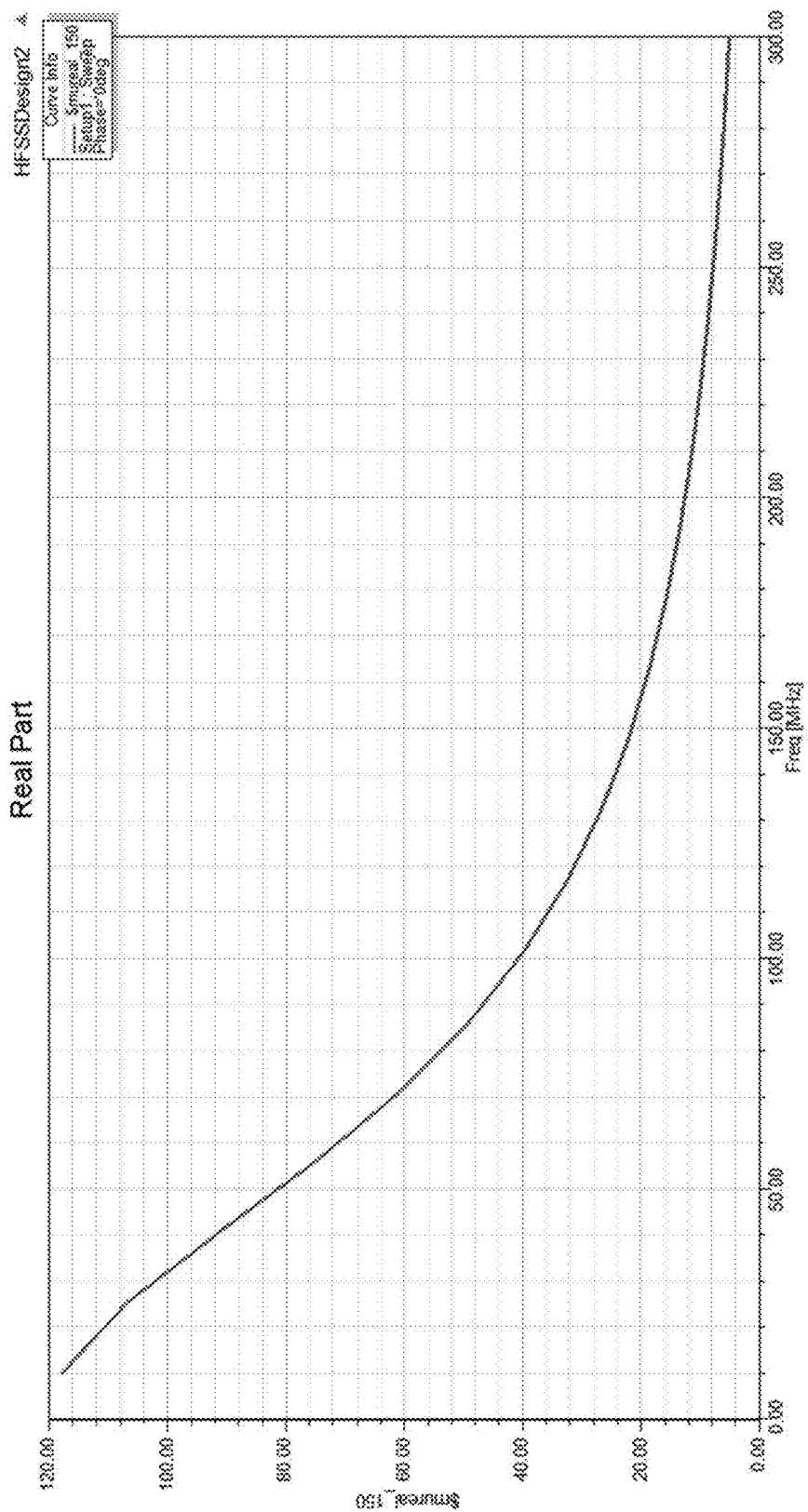
FIG. 8A shows a graph of a real permeability versus frequency for a magnetic antenna structure of FIG. 5.
Figure 8B:
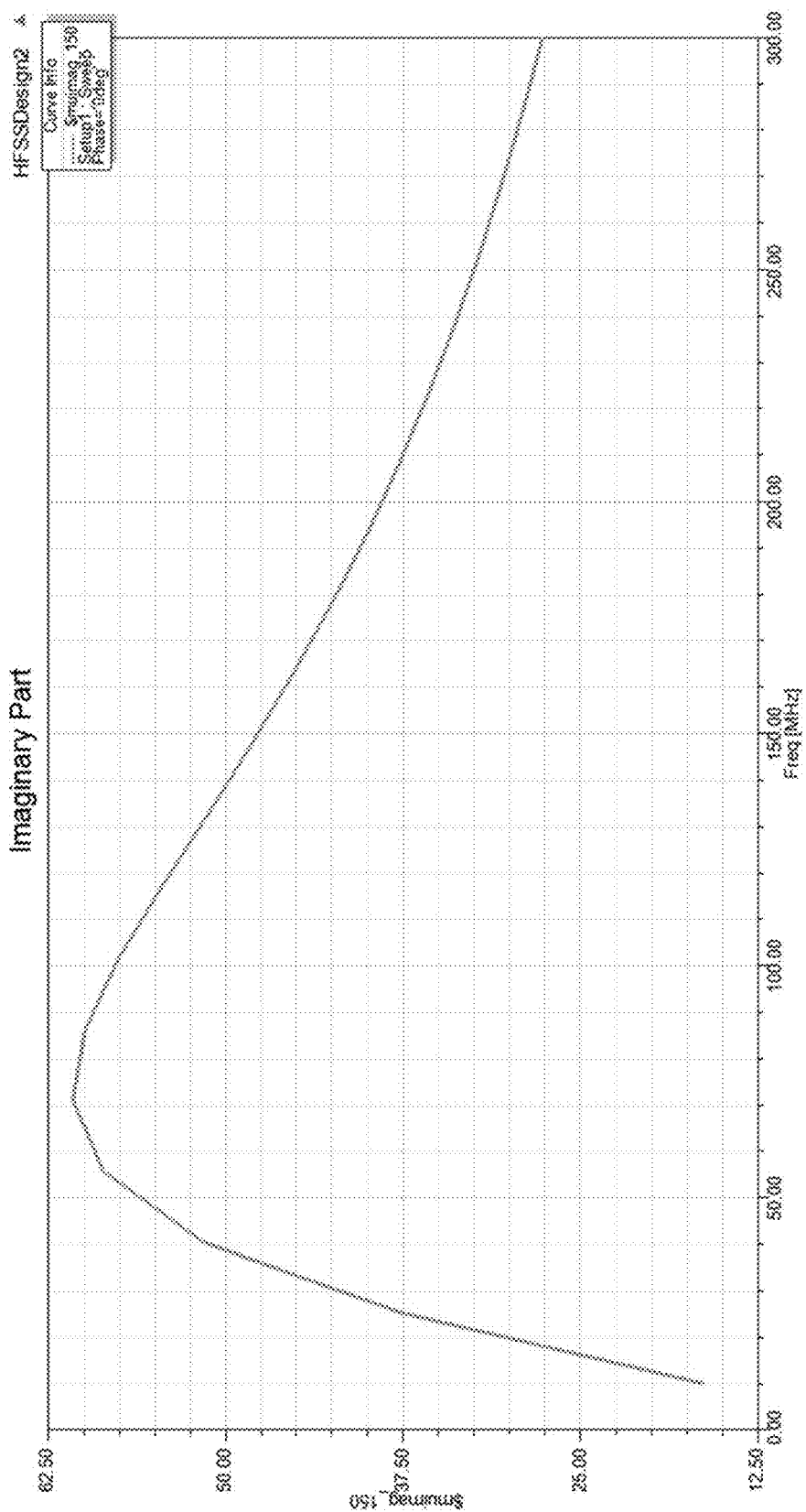
FIG. 8B shows a graph of an imaginary permeability versus frequency for a magnetic antenna structure of FIG. 5.

FIGS. 8A and 8B show graphs of a real permeability and an imaginary permeability versus frequency for a magnetic antenna structure of FIG. 5. In the specific example in FIGS. 8A and 8B, the magnetic antenna structure is structured to have a relative permeability of 150. The graphs in FIGS. 8A and 8B show that as frequency increases, the real permeability of the magnetic antenna structure decreases exponentially and the imaginary permeability of the magnetic antenna structure first increases, reaches a peak at approximately 70 MHz and then decreases. A decrease in the real permeability at higher frequencies can reduce the local field enhancement in the gap, which can adversely affect the detection sensitivity. As mentioned above, a material with a small imaginary permeability tends to improve antenna efficiency. The graphs in FIGS. 8A and 8B show that the magnetic antenna structure's frequency response can be improved above certain frequencies. For example, the frequency response of the magnetic antenna structure can be improved at least at frequencies greater than or equal to 120 MHz. In some other examples, the frequency response of the magnetic antenna structure can be improved at least at frequencies greater than or equal to 30 MHz. Thus, FIGS. 8A and 8B show that the magnetic antenna structures of FIGS. 5 to 7 can experience a roll-off of the magnetic field intensity at higher frequencies.

Figure 9A:
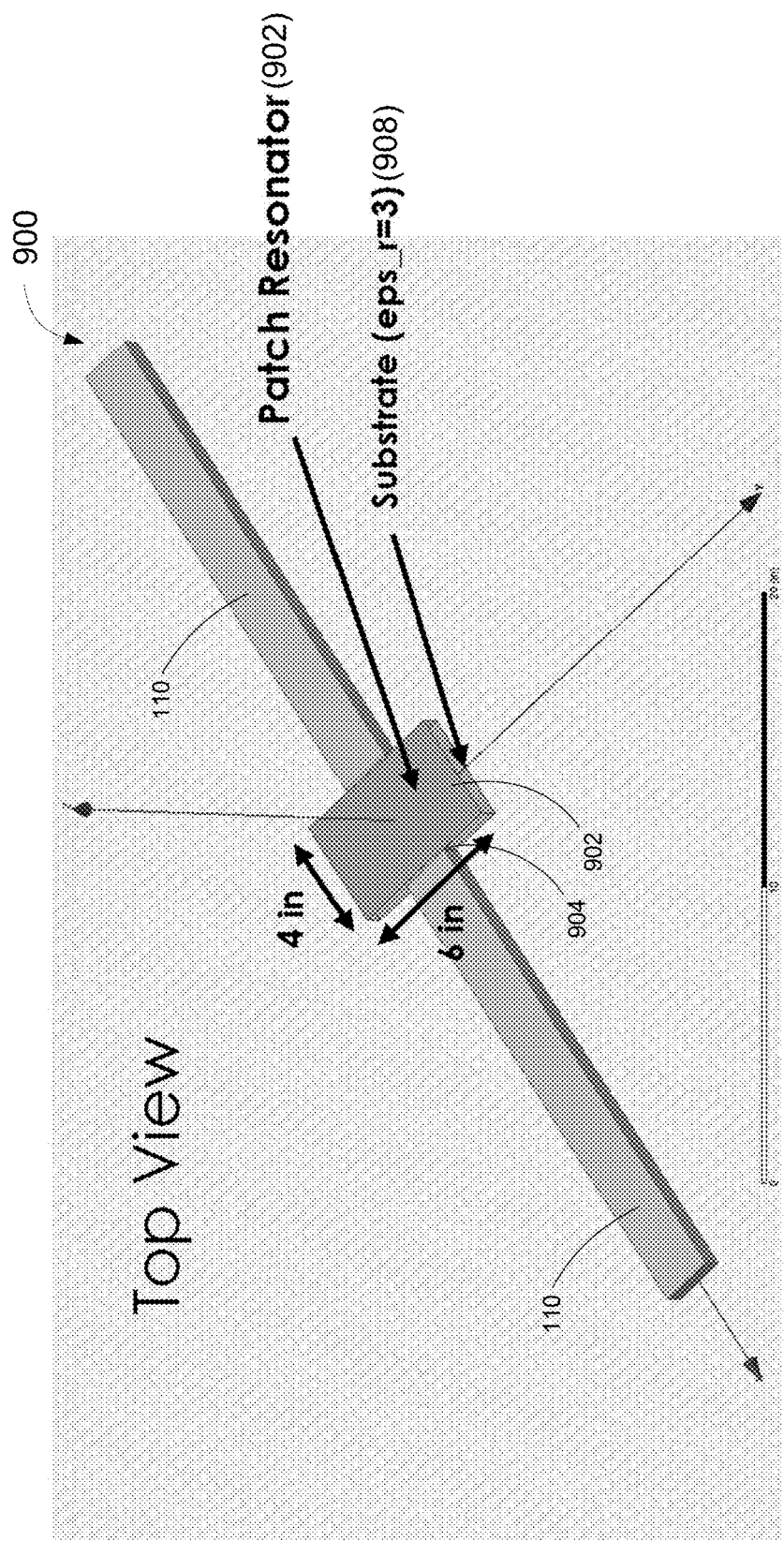
FIGS. 9A and 9B show a top view and a bottom view, respectively, of a spatially varying property such as a patch resonator located on a magnetic antenna structure.
Figure 9B:
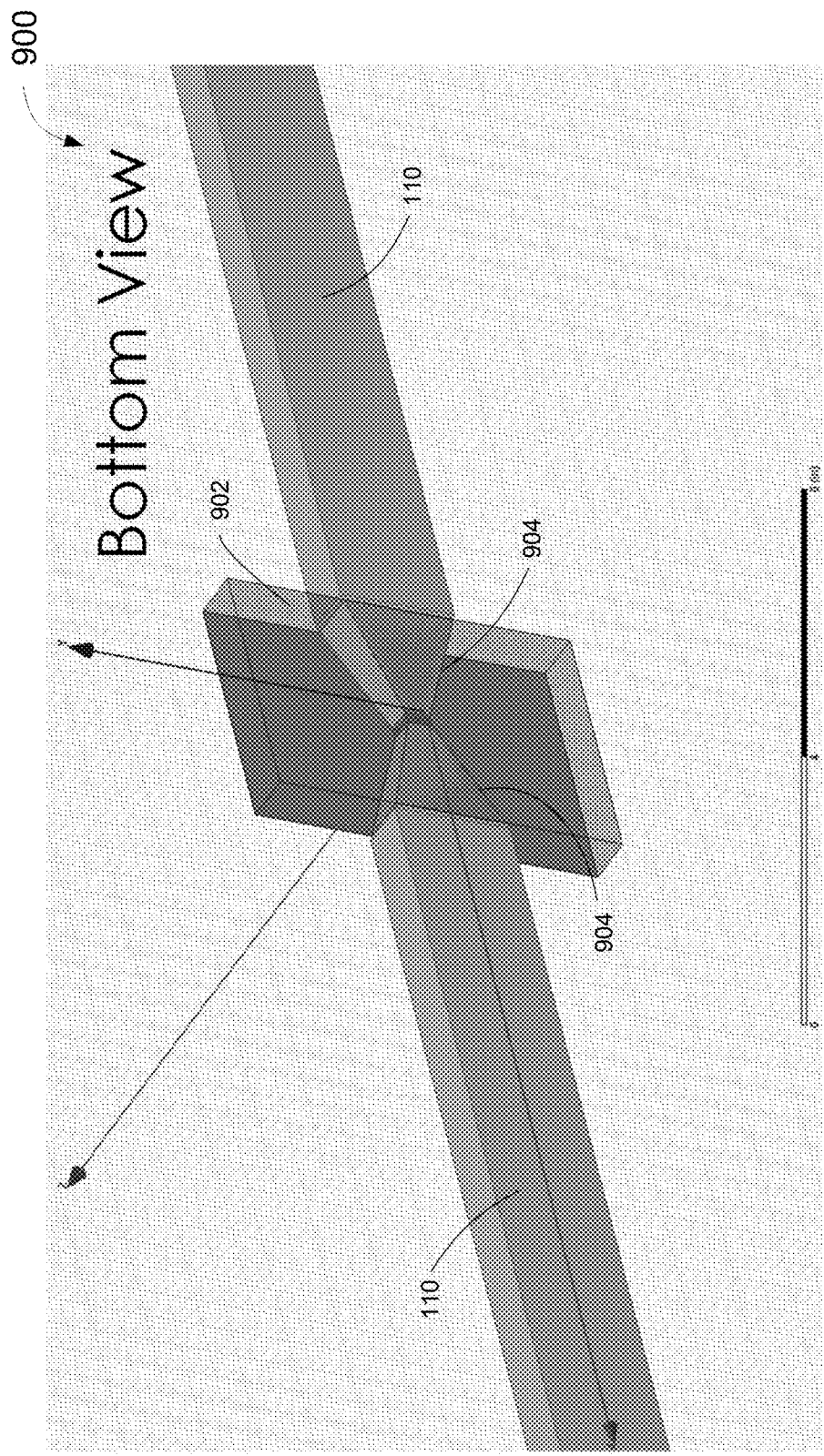

FIGS. 9A and 9B show a top view and a bottom view, respectively, of a spatially varying property such as a patch resonator 902 that can be located on or around the tapered or narrow section 904 of each antenna segment 110 of a magnetic antenna structure 900. Coupling a resonator to the tapered section of the magnetic antenna can mitigate the undesired roll-off at higher frequencies. The size or length of the bar 110 can be chosen to yield an optimal performance at the low end of the operating band. In some implementations, the dimensions of the patch resonator 902 can be chosen to allow the coupling between the bar 110 and patch resonator 902 to create a patch mode resonance at frequencies where the magnetic field enhancement due to the bar alone starts to reduce. The dimension of the patch resonator 902 can be less than the normal half-wavelength dimension without the bar due to the mutual interaction with the magnetic bar 110. In some implementations, as shown in graph 1102 of FIG. 11, a partially loaded patch resonator can have a resonant frequency at the upper end of the frequency band. One of the benefits of using a patch resonator with the bar is to improve the cut-off or pole of the permeability response of the bar without the patch resonator that is shown in graph 1104 of FIG. 11 to begin around 120 MHz to 150 MHz. In some implementations, as shown in FIG. 9A, the patch resonator 902 can have a width of 6 inches and a length of 4 inches.

The patch dimensions can be further reduced by inserting a permittivity substrate 908 in the patch resonator 902. The substrate of the patch resonator can be chosen to maintain the relative permittivity of the patch region close to the permeability of the bar at higher frequencies to maximize bandwidth. Further, various different patch resonator size reduction techniques, for example, substrate loading or meandering, can be used to maximize concentration the magnetic field in the transducer location. However, such reduction techniques may reduce the operating bandwidth. In some implementations, the relative permittivity of the patch resonator 902 and the substrate 908 can be 3.

The taper portion 904 of the bar 110 can be chosen to increase the field enhancement at the low end of the operating band. As further described in FIGS. 12A-12D and FIG. 13, there is a tradeoff between the amount of taper and the flux leakage. Also, there is a tradeoff in the field enhancement bandwidth and amount loading of the patch resonator. This trade-off may be viewed a consequence of increasing the quality factor of the patch resonator. In some implementations, both the patch resonator 902 and bar taper 904 can be co-designed so that their respective structures can be determined to achieve desired antenna performance characteristics.

The addition of the patch resonator 902 can have minimal effect on the magnetic antenna 900 below the antenna's characteristic modal cutoff frequency. Thus, one of the benefits of the exemplary patch resonator 902 is that it can extend the frequencies of operation with improved realized gain and receiver sensitivity. Another benefit of the magnetic antenna with the exemplary patch resonator 902 is that the gain-bandwidth product performance of such an antenna can be improved. These benefits, among others, are further shown in FIG. 10, discussed below. Another benefit of the patch resonator is that it can reduce cost by using less material for a magnetic antenna for the same performance. Furthermore, the exemplary patch resonator can also be used to extend the range of a magnetic antenna that uses lower cost and lower performing materials.

Figure 10:
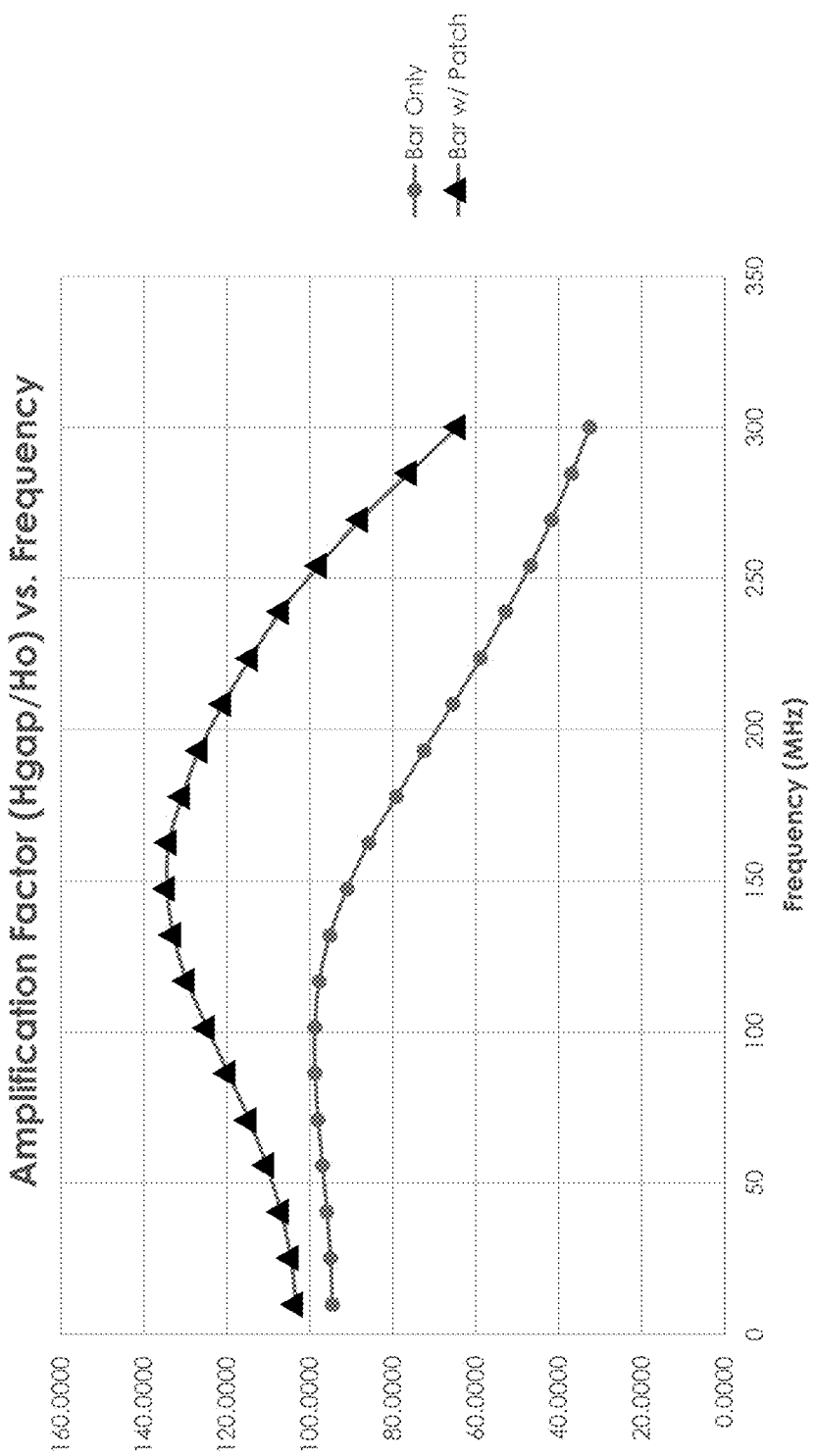
FIG. 10 is a graph of the amplification factor versus frequency of the magnetic antenna structure with and without the exemplary patch resonator.

FIG. 10 is a graph of the amplification factor versus frequency of the magnetic antenna structure with and without the exemplary patch resonator. The y-axis relates to amplification factor (Hgap/Ho) of the gap with the exemplary optical crystal between the tapered or narrow section of the bar shaped magnetic antenna structure. The amplification factor in FIG. 10 is obtained dividing the total induced magnetic field in the gap by the incident magnetic field. As shown in FIG. 10, the amplification factor of the bar starts to decrease at approximately 120 MHz. In contrast, the amplification factor of the bar with the patch resonator at more than 250 MHz. Furthermore, while the amplification factor of the bar increases slightly from approximately 10 MHz to 120 MHz, the amplification factor of the bar with the patch increases more from approximately 10 MHz to 150 MHz. Thus, FIG. 10 shows that the bar with the patch resonator both improves the amplificatory factor at the desired frequencies and allows for wideband operations at least at frequencies where the magnetic polarizability of the bar without the patch resonator begins to degrade.

Figure 11:
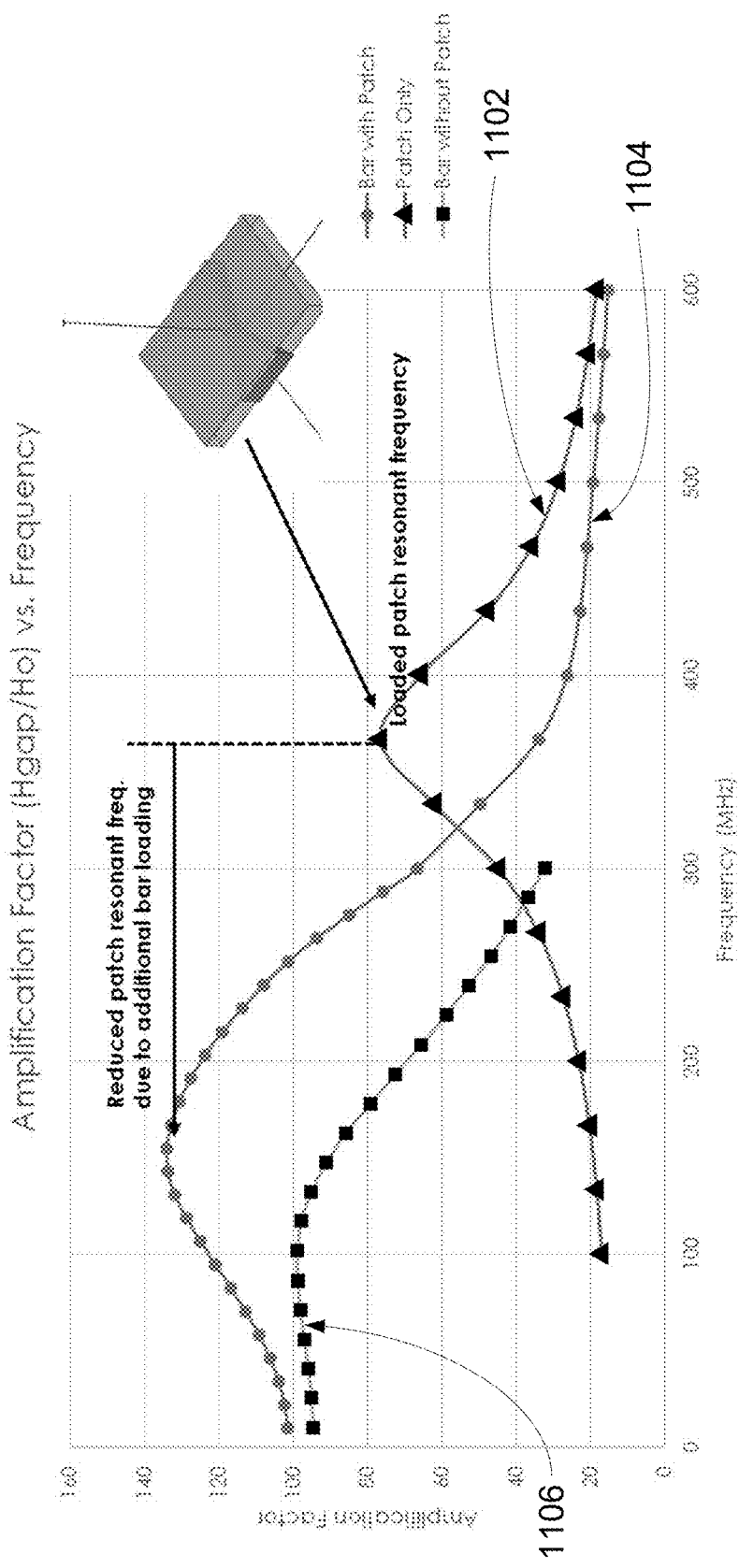
FIG. 11 is a graph of the amplification factor versus frequency of the exemplary patch resonator loaded by a residual bar material, and the magnetic antenna structure with and without the exemplary patch resonator.

FIG. 11 is another graph of the amplification factor versus frequency of the exemplary patch resonator loaded by a residual bar material, and the magnetic antenna structure with and without the exemplary patch resonator. The graph 1102 relates to the patch resonator loaded by the residual bar material and shows that the patch resonator can have a resonant frequency of approximately 375 MHz. The graph 1104 relates to the bars of the magnetic antenna structure with the patch resonator. The graph 1104 shows that by loading the patch resonator by the bar material, the resonant frequency of the patch resonator with the residual bar is reduced due to the additional bar loading. The graph 1106 shows the amplification factor of the bar without a patch resonator as described in FIG. 10. The graph 1102 show that the low frequency contribution of the bar length is not observed for the patch loaded with the residual bar material. Thus, the graph 1104 shows that there is a coupled response of the composite magnetic bar and the patch resonator.

Figure 12A:
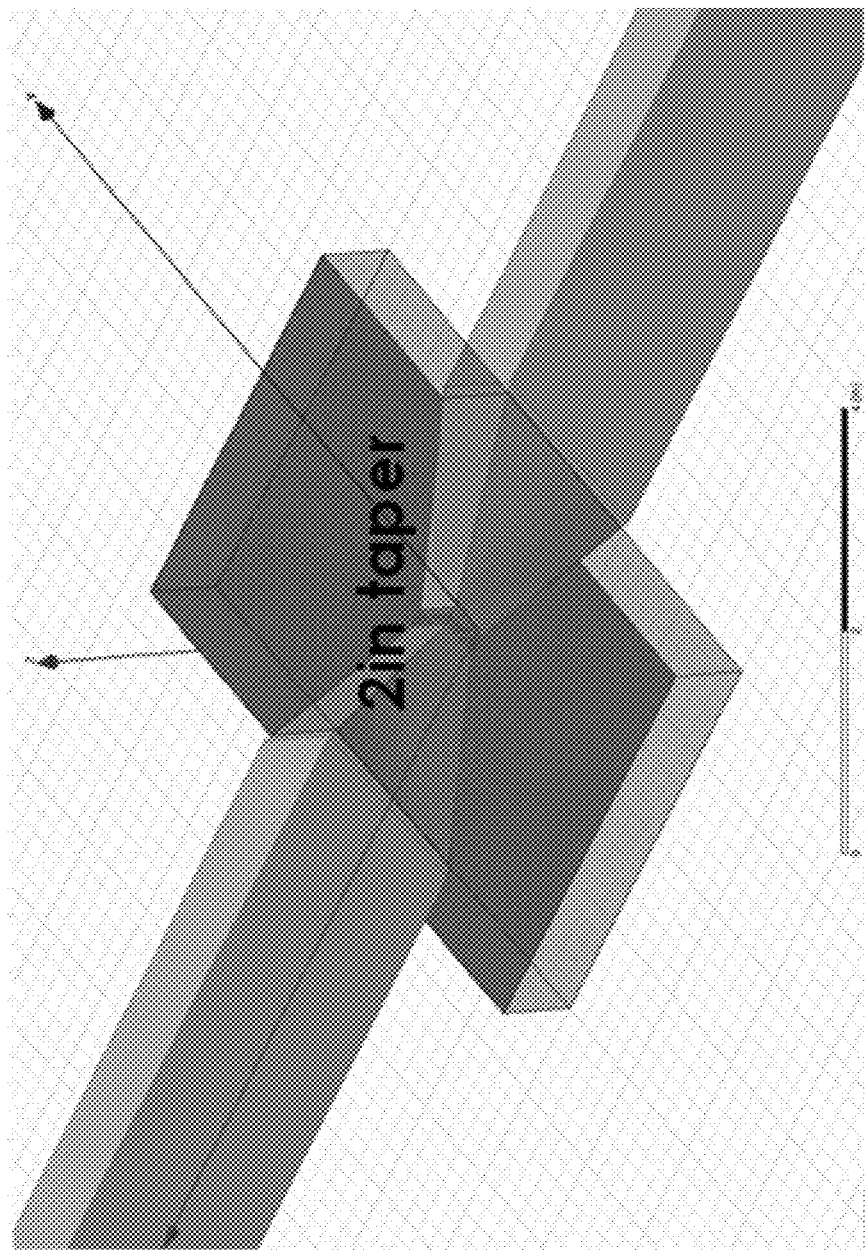
FIGS. 12A to 12D show the various exemplary tapered or narrow sections that can be implemented for the bar of the magnetic antenna structure.
Figure 12B:
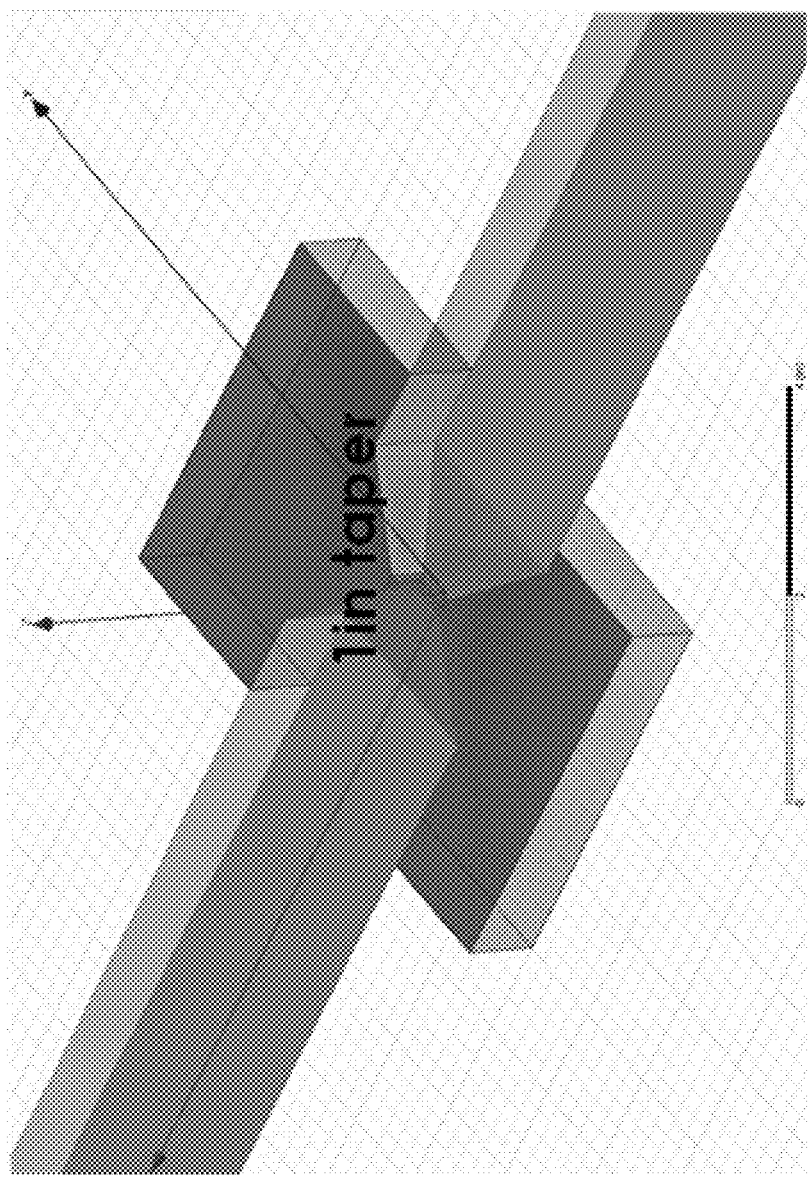
Figure 12C:
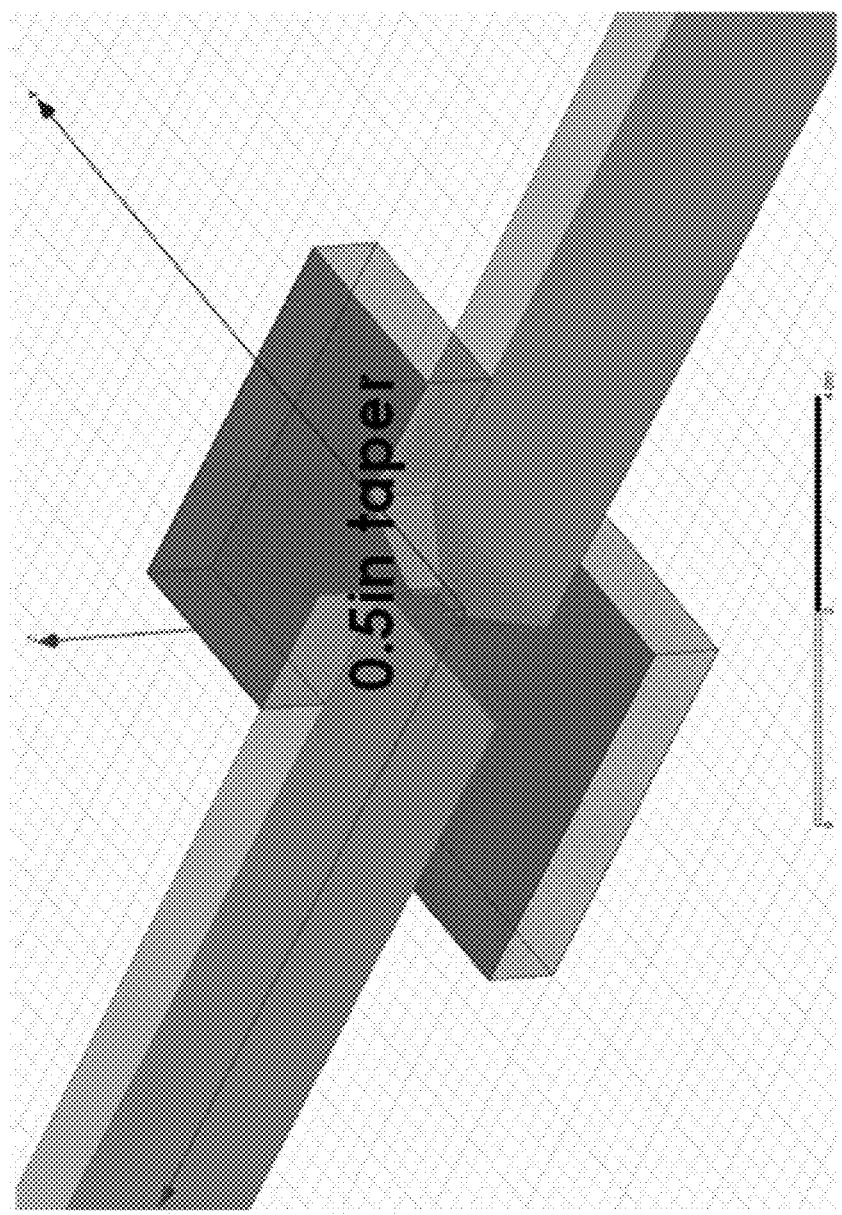
Figure 12D:
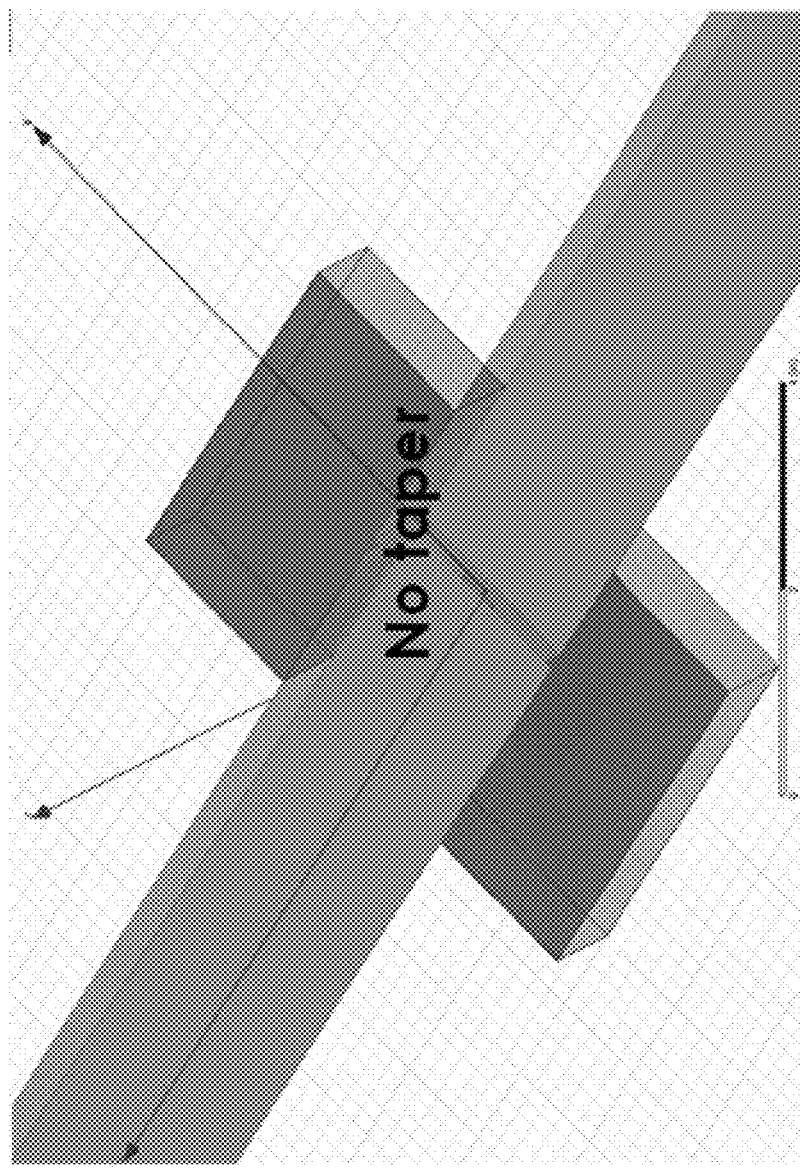

FIGS. 12A to 12D show the various exemplary tapered or narrow sections that can be implemented for the bar of the magnetic antenna structure. For example, FIG. 12A shows a bar with a 2 inch taper, FIG. 12B shows a bar with a 1 inch taper, FIG. 12C shows a bar with a 0.5 inch taper and FIG. 12D shows a bar with no taper and just a gap between the bars of the magnetic antenna structure. In the embodiment shown in FIG. 12D, the resonator can be located at or near an area that includes a gap region in between the two bar shaped antenna segments. The magnetic field versus the frequency response of the bars with the various tapered sections is further described in FIG. 13.

Figure 13:
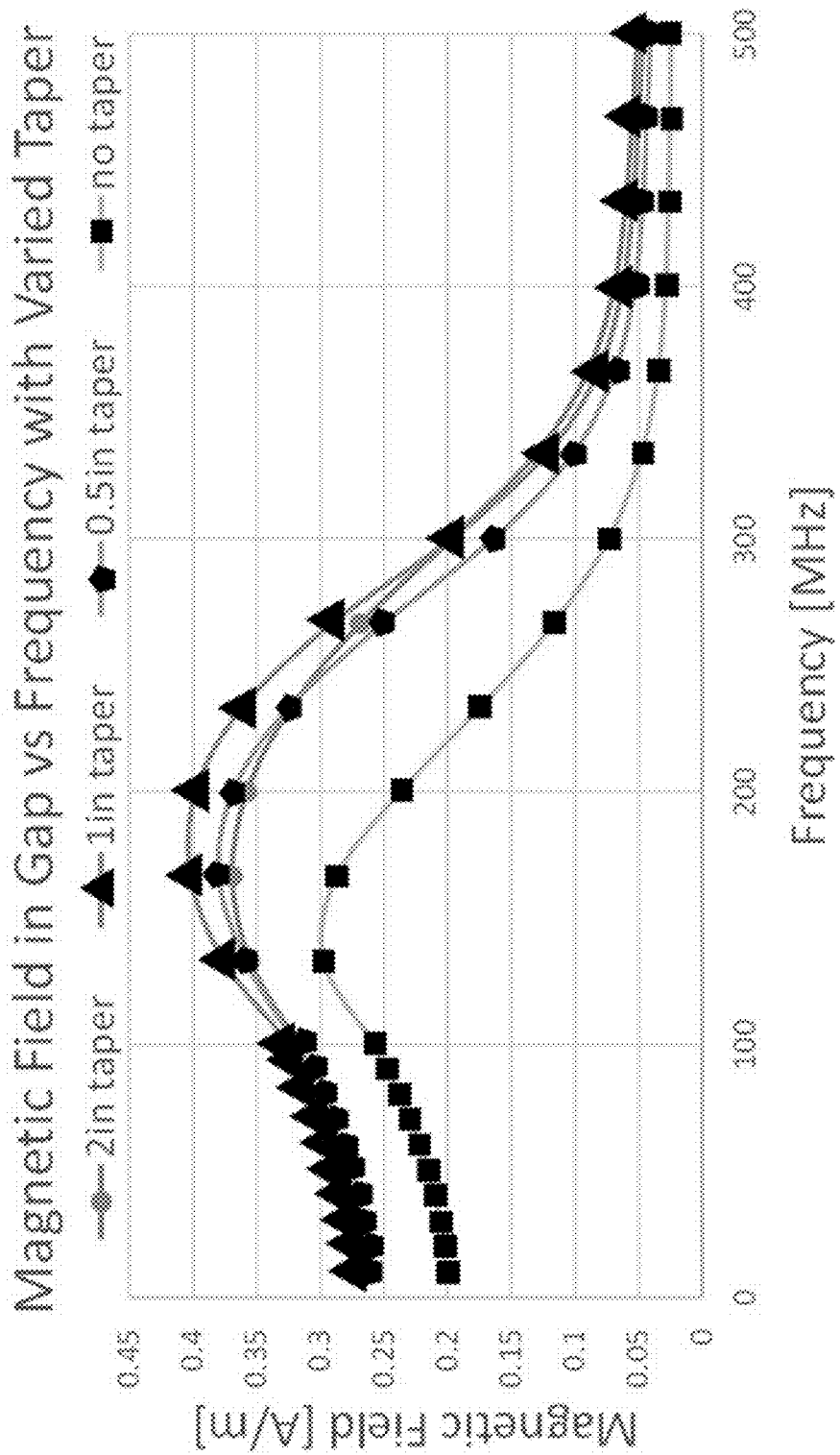
FIG. 13 shows a graph of the magnetic field in the gap versus the frequency of the magnetic antenna structure for various tapered sections of FIGS. 12A-12D.

FIG. 13 shows a graph of the magnetic field in the gap versus the frequency of the magnetic antenna structure for various tapered sections of FIGS. 12A-12D. FIG. 13 generally shows that tapering of the bar can increase the magnetic field at the desired frequencies. For instance, a bar with no taper when compared to a bar with a 1 inch taper shows that the magnetic field increases from 0.2 A/m to 0.28 A/m at approximately 10 MHz and from 0.3 A/m to 0.37 A/m at 125 MHz. Furthermore, a bar with a tapered section can improve the magnetic field of the gap at higher frequencies. For example, the magnetic field, and therefore, the magnetic polarizability of a bar with no taper can decrease at frequencies more than 150 MHz. In contrast, for a bar with a tapered region, the magnetic field can decrease at frequencies more than 200 MHz.

The disclosed technology based on using a spatial varying property profile in a magnetic antenna structure to achieve one or more benefits can be combined with other magnetic performance enhancing techniques. For example, different from many antennas formed of metals, the magnetic materials can be exposed to a control magnetic field such as a DC magnetic field and the interaction between the control magnetic field and the magnetic material can cause a physical change in the material, e.g., the permeability in the magnetic antenna structure, and this physical change can lead to a change in one or more antenna properties associated with the permeability. This tuning or biasing capability can be combined with the spatially varying antenna profile in magnetic antenna devices.

Figure 14:
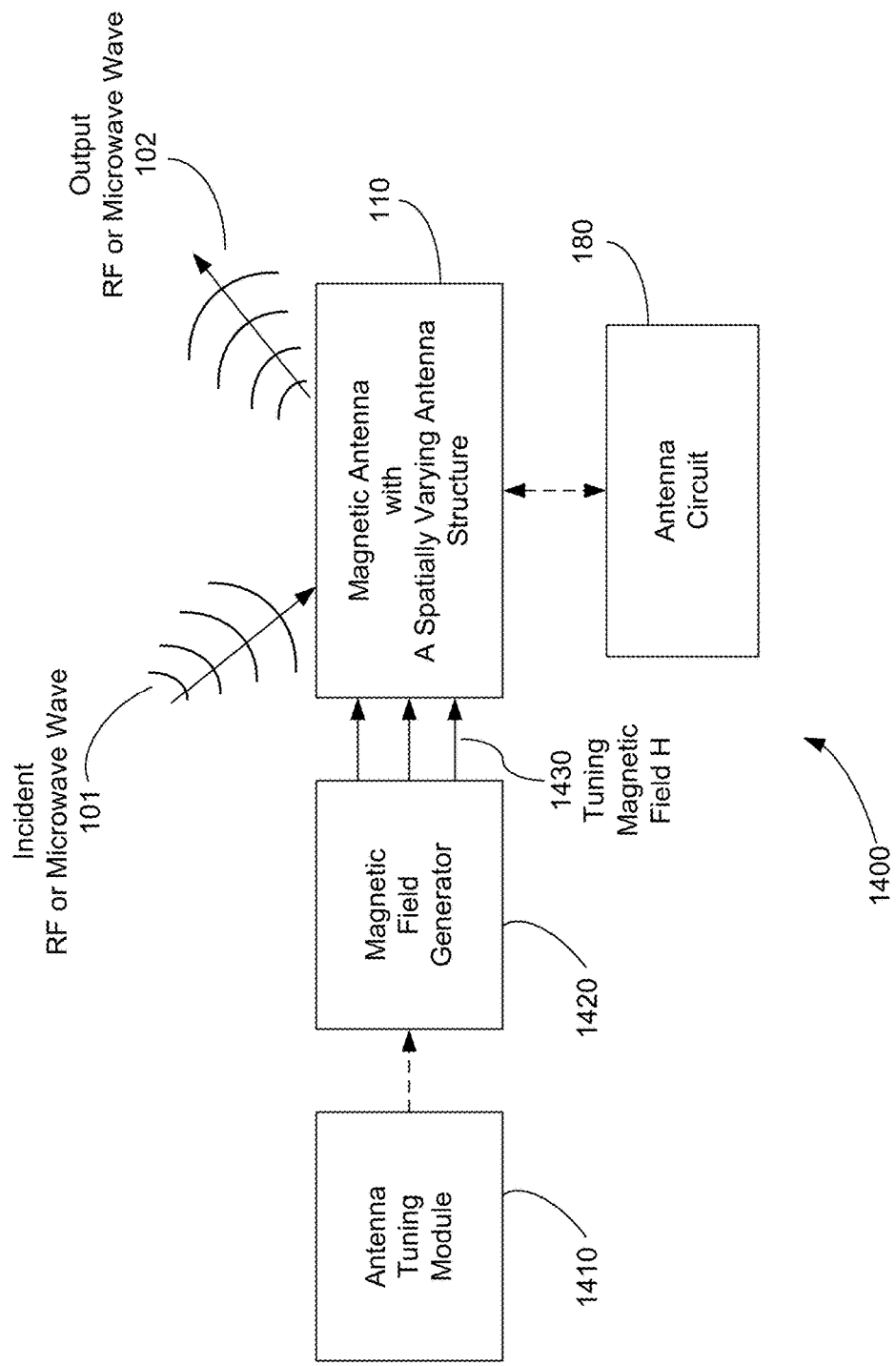
FIG. 14 shows an example for combining a tuning feature to the device in FIG. 1.

FIG. 14 illustrates an example of a magnetic antenna device 1400 that combines H-tuning with a spatially varying antenna structure. This device 1400 includes an antenna tuning module 1410 and a magnetic field generator 1420 to the device in FIG. 1. The magnetic antenna 110 that is ferromagnetic and interacts with an incident radio frequency or microwave signal to concentrate a magnetic field of the incident radio frequency or microwave signal locally in or near the magnetic antenna 110. The magnetic antenna 110 exhibits a material magnetization (M). In various implementations, the magnetic antenna 110 can be configured to exhibit a desired magnetic anisotropy so that the magnetization has a preferred direction (also known as the easy axis) due to the material property such as the material composition structure or the material shape. In other implementations, the magnetization may also be isotropic. The magnetic bias generator 1420 is provided to generate a control or tuning magnetic field 1430 (e.g., a DC magnetic field) at the magnetic antenna 110 and the presence of this magnetic field 1430 (H) affects the material and can be used to cause a change in one or more physical properties (e.g., the permeability) in the magnetic antenna 110. The tuning magnetic field 1430 can be used to change an antenna property associated with the permeability. The antenna tuning module 1410 is communicatively coupled to the magnetic bias generator 1420 to adjust the DC magnetic field in tuning the permeability and the associated antenna property of the magnetic antenna 110.

The permeability and other material properties can change with the applied DC magnetic field. This and other changes can lead to corresponding changes in one or more associated antenna properties of the magnetic antenna 110. Some examples of antenna parameters are the antenna gain, antenna bandwidth, antenna impedance, antenna voltage standing wave ratio (VSWR) or standing wave ratio (SWR). Tuning those and other antenna parameters provides valuable post-manufacture tuning in operating such an antenna to improve the antenna performance based on specific operating conditions. For example, the antenna impedance is an important antenna parameter for the desired impedance matching condition and can adversely impact the antenna efficiency if not properly selected. The tunable device in FIG. 14 allows the impedance to be tuned or adjusted by controlling the magnetic field H to control the permeability value. For another example, the permeability value is also associated with the antenna frequency bandwidth and the resonant frequency so that the tuning can adjust the antenna frequency bandwidth and the resonant frequency during the antenna operation.

Figure 15:
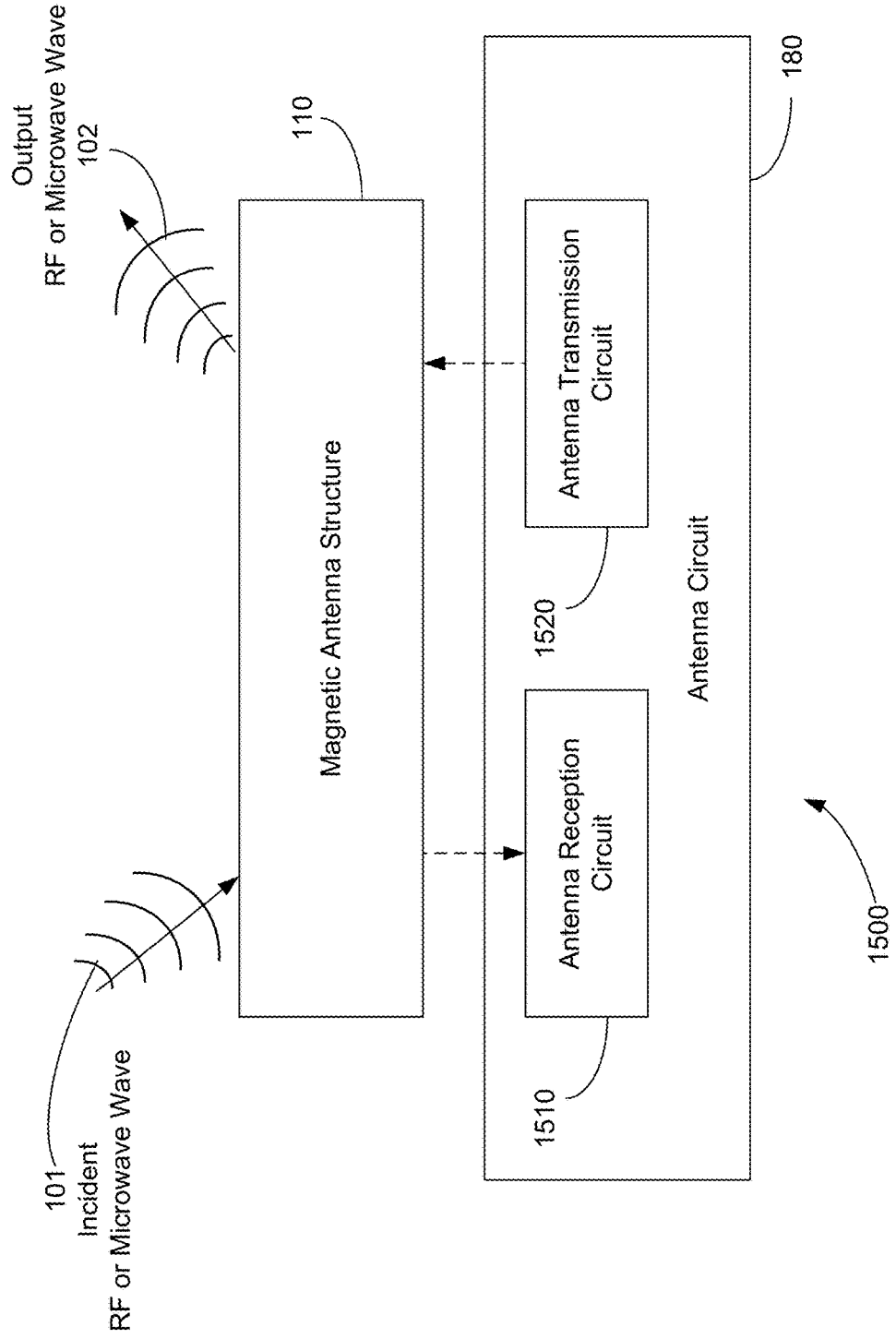
FIG. 15 shows an example of a magnetic antenna device that uses separate antenna reception and transmission circuits to allow individual optimization of reception and transmission operations.

As discussed in connection with the example in FIG. 4, the transmit and receive componentry of a magnetic antenna device can be decoupled so that each can be individually optimized for its specific role. FIG. 15 shows such an example 1500 where a designated antenna reception circuit 1510 is coupled to the magnetic antenna structure 110 to perform the reception operations, e.g., converting the localized magnetic field caused by the received radio frequency or microwave signal 101 into a local signal which is further processed to extract information carried by the received radio frequency or microwave signal 101. Separate from the antenna reception circuit 1510, a designated antenna transmission circuit 1510 is coupled to the magnetic antenna structure 110 to perform transmission operations, e.g., producing a local antenna signal carrying information to be transmitted and cause the local antenna signal to be carried in the output radio frequency or microwave signal 102 radiated by the magnetic antenna structure 110 (e.g., a conductive wire loop as part of the antenna transmission circuit 1520 where the varying currents in the loop generates oscillating magnetic fields in the magnetic antenna structure 110 to cause radiation of the output electromagnetic signal 102).

This designated reception circuit 1510 can be implemented in various configurations. For example, a conductive wire loop can be configured and optimized for receiving the incoming RF or microwave signal 101. The following sections provide two examples of magnetic antenna devices that use designated antenna reception circuits based on magnetoresistive (MR), magneto-optic (MO) or electro-optical (EO) effects.

Figure 16:
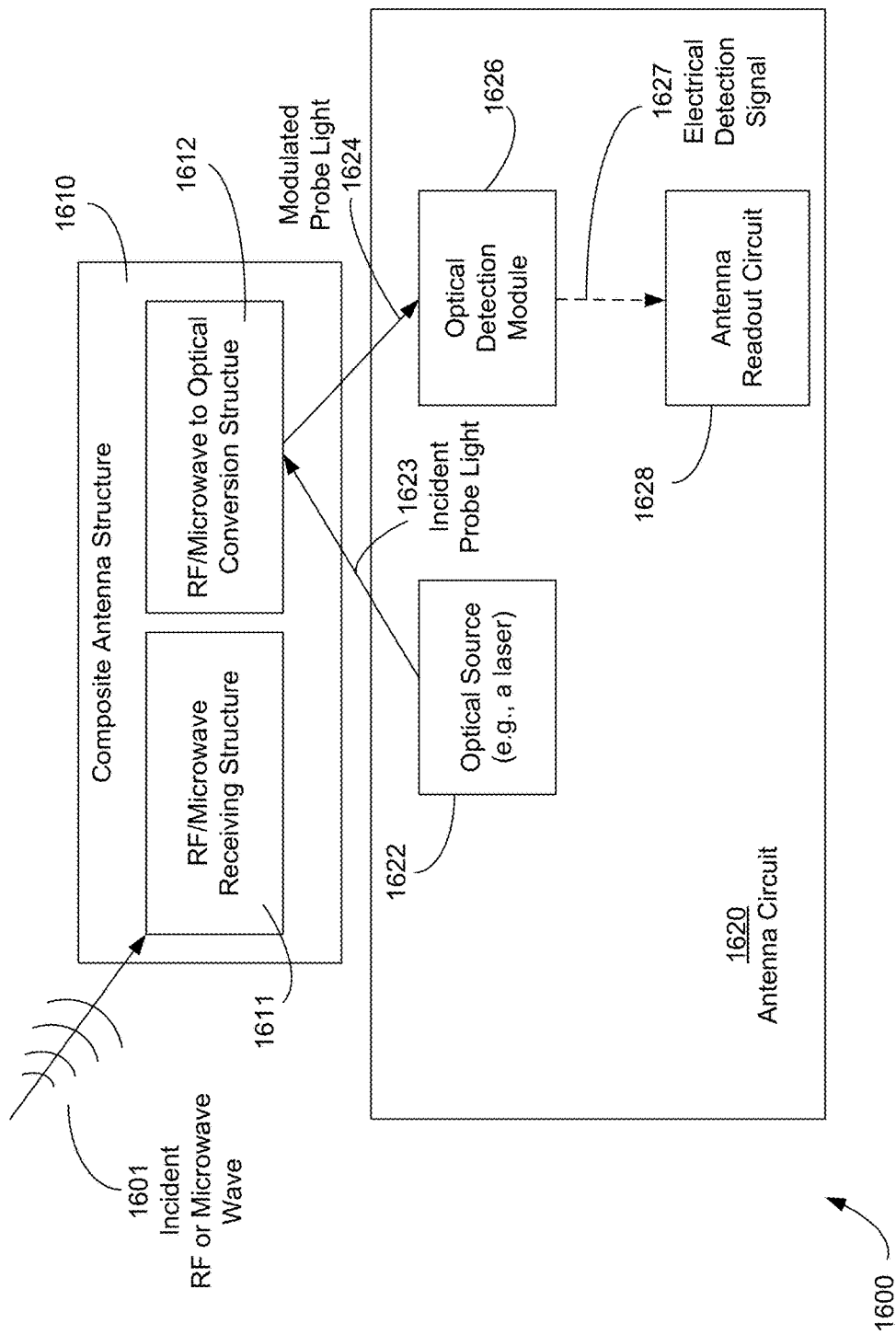
FIG. 16 shows an example of a magnetic antenna device that includes an antenna reception circuit using optical sensing as part of the antenna readout circuit.

FIG. 16 shows an example of an antenna device with a designated antenna reception circuit that implements a 3-step signal conversion to generate a local signal for antenna receiver operation. First, the incoming electromagnetic signal is captured as a local signal, both being in the same frequency domain of either the radio frequency (RF) or microwave frequency range. Second, the local signal is converted from the RF or microwave (MW) frequency range into an optical signal in the optical frequency range, e.g., an optical polarization signal. This RF/MW to optical conversion can be implemented based on an optical effect selected from various suitable optical effects in such an antenna device. Specifically, materials exhibiting a magneto-optical effect may be included in the antenna devices and are disclosed as examples to convert the RF/MW signal into the desired optical signal. Other optical materials, such as those exhibiting electro-optical effects, may also be used to achieve this RF/MW to optical conversion. Third, the optical signal is directed into an optical detector (e.g., a fast photodiode) within the antenna device that converts the optical signal back into an electrical RF or MW signal for further processing in the antenna device.

The disclosed 3-step signal conversion from the RF/MW frequency range to the optical frequency range and back to the RF/MW frequency range provides a unique antenna signal processing platform that enables certain signal processing operations to be performed in the optical domain and by using optical signal processing devices and techniques to achieve one or more technical or operational advantages or benefits. For example, certain signal processing limitations in the RF or MW frequency range may be mitigated or avoided when performing such processing by using optical devices in the optical domain. For another example, certain optical processing may be used in such antenna devices that would not otherwise be possible with other antenna devices that only rely on circuitry and processing in the RF or MW frequency range. In this regard, the disclosed antenna devices reflect a departure from various antenna designs that solely rely on circuitry and processing in one frequency domain (usually in the RF or MW frequency domain) and that perform the antenna operations based on transducing the power from a received electromagnetic wave into a guided wave on a transmission line. The disclosed antenna devices provide a "hybrid" antenna device platform with a local signal concentrator in combination with an optical or photonic inner core to benefit from both the RF/WM domain and the optical domain.

In FIG. 16, the antenna device 1600 includes a composite antenna structure 1610 and an associated antenna circuit 1620 containing an optical or photonic inner module. The composite antenna structure 1610 includes a first structure 1611 (RF/Microwave Receiving Structure) that electromagnetically couples with an incoming radio frequency or microwave signal 1601 to produce a local electromagnetic signal (e.g., in form of an oscillating magnetic field signal or an oscillating electric field signal) for the first of the three conversions, and a second structure 1612 (RF/Microwave to Optical Conversion Structure) that is coupled to the first structure 1611 to be within the local electromagnetic field caused by the received radio frequency or microwave signal to produce modulated optical signal that carries the information of the incoming electromagnetic signal 1601. The first structure 1611 for receiving the RF/microwave signal is designed to function as a magnetic flux concentrator that increases the strength of the magnetic flux of the received RF/microwave signal locally to facilitate the efficient RF/microwave to optical conversion in the second structure 1612. In various applications, the first structure 1611 can be implemented by magnetic materials for the magnetic antenna 110 in FIG. 1. The second structure 1612 may, for example, include a material or device that exhibits a magneto-optical effect and converts the magnetic field of the local electromagnetic signal produced by the first structure 1611 into the modulated optical signal in some implementations, e.g., modulated optical polarization. In some other implementations, for example, this second structure 1612 may include a material or device that exhibits an electro-optical effect and converts the electric field of the local electromagnetic signal into the modulated optical signal in some other implementations.

The antenna circuit 1620 can include antenna transmit circuitry that performs functions for transmitting an outgoing antenna signal and antenna receiver circuitry that performs functions in connection with receiving the incoming electromagnetic signal 1601. FIG. 16 illustrates a part of the antenna receiver circuitry that involves the optical processing part of the operation of the antenna device 1600. Specifically, the antenna receiver circuitry includes a light source 1622 that emits probe light 1623 that is directed to the second structure 1612 of the composite antenna structure 1610 so that the second structure 1612 interacts with the probe light 1623 to produce modulated probe light 1624 due to the optical conversion operation such as a magneto-optical (MO) effect or electro-optic (EO) effect and the presence of the received radio frequency or microwave signal. The modulated probe light 1624 produced by the second structure 1612 carries the information in the received incoming radio frequency or microwave signal 1601. An optical detection module 1626 is provided and located to receive the modulated probe light 1624 and to convert the modulated probe light 1624 into a detection signal 1627 that carries the information in the received radio frequency or microwave signal 1601. This is the third part of the three conversions discussed above. As shown, the antenna circuit 1620 can include an antenna readout circuit 1628 coupled to receive the detection signal 1627 from the optical detection module 1626 and is operable to process the detection signal 1627 to extract the information in the received radio frequency or microwave signal 1601.

Figure 17:
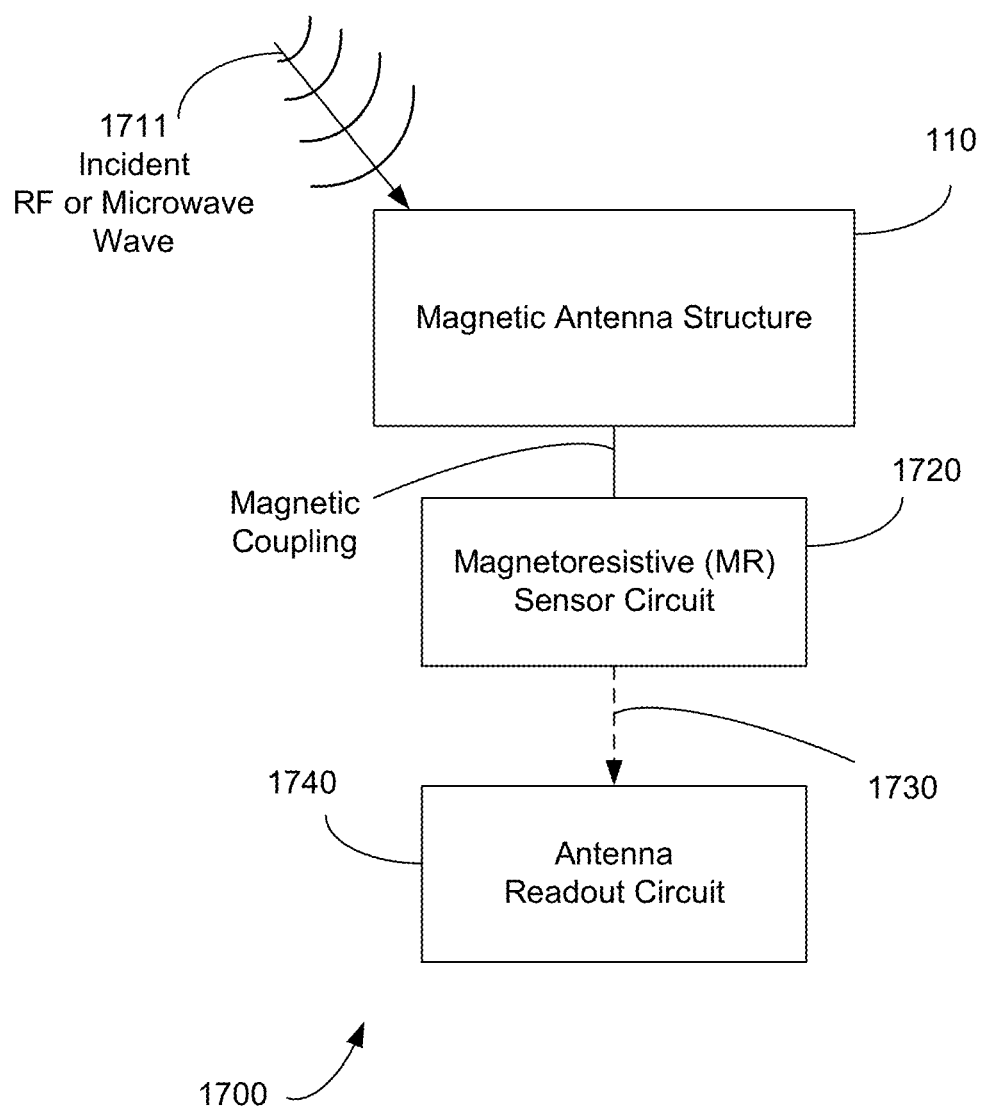
FIG. 17 shows an example of a magnetic antenna device that includes an antenna reception circuit using a magnetoresistive (MR) sensor circuit as part of the antenna readout circuit.

FIG. 17 shows an example of an antenna device with a designated antenna reception circuit that implements a magnetoresistive (MR) effect in which the electrical resistance of a material changes with an applied magnetic field to the material. A MR sensor circuit can be constructed by using a MR material and a circuit coupled to measure the variation of the resistance of the MR material under the magnetic field.

In FIG. 17, a composite antenna structure 1700 that couples with a received radio frequency or microwave signal 1711 to receive at least a portion of the radio frequency or microwave signal 1711; and an antenna receiver circuit that is communicatively coupled with the magnetic antenna structure 110 which may be implemented in various ways as disclosed above including using composite structures. The antenna receiver circuit includes an MR sensor circuit 1720 located relative to the composite antenna structure 110 to be within an electromagnetic field caused by the received radio frequency or microwave signal. The MR sensor circuit 1720 exhibits an MR effect and an associated variable resistance to sense a magnetic field of the electromagnetic field caused by the received radio frequency or microwave signal to produce an MR sensor signal 1730 that carries the information in the incident or received radio frequency or microwave signal 1711. The antenna receiver circuit is operable to process the MR sensor signal 1730 to extract the information. An antenna readout circuit 1740 can be used to perform the processing of the MR sensor signal 1730. The composite antenna structure 110 in FIG. 17 is shown as a receiving antenna and can also be used to radiate or emit an output RF or microwave signal.

In some of the examples of the magnetic antenna devices disclosed herein, e.g., those in FIGS. 2A, 2B, 3, 4, 5-7, 9A-9B, 12A-12D, a conformal magnetic antenna configuration can be used so that a ferromagnetic material antenna structure is placed over an electrically conductive surface as such a metal ground plane. A magnetic antenna device for implementing the disclosed technology may also be implemented in other configurations where a ferromagnetic material antenna structure can be magnetically excited. For example, a ferromagnetic material antenna structure can be shaped as a ferromagnetic antenna loop that is configured to enclose an electrically conductive object, a dielectric object or a lossy dielectric object. An antenna circuit is coupled to this combination of the ferromagnetic antenna loop and the object surrounded by the loop for antenna transmission or receiver operations. The ferromagnetic antenna loop is structured to operate with the conductive, the dielectric or the lossy dielectric object to radiate the electromagnetic energy from the antenna circuit or to receive the electromagnetic energy and to direct the received electromagnetic energy to the antenna circuit. In some embodiments, such a magnetic antenna device can include an electrically conductive loop engaged to the inner side of the ferromagnetic antenna loop to provide an electrically conductive interface between the conductive or the dielectric or the lossy dielectric object and the ferromagnetic antenna loop. More specifically, in a magnetically excited structural antenna in the above loop design, an MR sensor can be used for sensing the incident RF or MW signal.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Thus, particular embodiments have been described. Variations and enhancements of the described embodiments and other embodiments can be made based on what is described and illustrated.

What is claimed is:

1. A magnetic antenna device, comprising:
 a magnetic antenna structure that is ferromagnetic and interacts with a radio frequency or microwave signal to receive and concentrate a magnetic field of the radio frequency or microwave signal locally in or near the magnetic antenna structure, the magnetic antenna structure configured to include different antenna segments arranged lengthwise along a length of the magnetic antenna structure;
a resonator located at or near a region between the antenna segments and coupled to exchange magnetic energy with the magnetic structure, wherein the resonator is structured to be in resonance with one or more modes of the magnetic field, wherein each of two antenna segments near the resonator includes a tapered region that varies spatially from one location to another location at one end of each antenna segment, the tapered region of one antenna segment located across from another tapered region of the other antenna segment; and
an antenna circuit communicatively coupled to the magnetic antenna structure to receive an antenna signal from the magnetic antenna structure associated with the received and concentrated magnetic field of the radio frequency or microwave signal locally in or near the magnetic antenna structure and to supply an output antenna signal to the magnetic antenna structure for transmission.

2. The antenna device as in claim 1, wherein the resonator includes a rectangular shape structure.

3. The antenna device as in claim 1, wherein a width of the resonator is larger than a width of the magnetic antenna structure.

4. The antenna device as in claim 1, wherein the resonator includes a substrate.

5. The antenna device as in claim 4, wherein the resonator and the substrate include materials that have a relative permittivity of 3.

6. The antenna device as in claim 1, wherein the two antenna segments include a spatially uniform profile along the length of the magnetic antenna structure.

7. The antenna device as in claim 1, wherein a length of the tapered region is 0.5 inch, 1 inch, or 2 inches.

8. The antenna device as in claim 1, wherein the antenna segments include materials that have a relative permeability of 150.

9. A magnetic antenna device, comprising:
a magnetic antenna structure that is ferromagnetic and interacts with a radio frequency or microwave signal to receive and concentrate a magnetic field of the radio frequency or microwave signal locally in or near the magnetic antenna structure, the magnetic antenna structure configured to include different antenna segments arranged lengthwise along a length of the magnetic antenna structure;
a resonator located at or near a region between the antenna segments and coupled to exchange magnetic energy with the magnetic structure, wherein the resonator is structured to be in resonance with one or more modes of the magnetic field, wherein one antenna segment at or near the resonator includes a tapered region that varies spatially from one location to another location at one end of the antenna segment where the resonator is located; and
an antenna circuit communicatively coupled to the magnetic antenna structure to receive an antenna signal from the magnetic antenna structure associated with the received and concentrated magnetic field of the radio frequency or microwave signal locally in or near the magnetic antenna structure and to supply an output antenna signal to the magnetic antenna structure for transmission.

10. The antenna device as in claim 9, wherein the resonator includes a rectangular shape structure.

11. The antenna device as in claim 9, wherein a width of the resonator is larger than a width of the magnetic antenna structure.

12. The antenna device as in claim 9, wherein the one antenna segment includes a spatially uniform profile along the length of the magnetic antenna structure.

13. A magnetic antenna device, comprising:
a magnetic antenna structure that is ferromagnetic and interacts with a radio frequency or microwave signal to receive and concentrate a magnetic field of the radio frequency or microwave signal locally in or near the magnetic antenna structure, the magnetic antenna structure configured to include different antenna segments arranged lengthwise along a length of the magnetic antenna structure;
a resonator located at or near a region between the antenna segments and coupled to exchange magnetic energy with the magnetic structure, wherein the resonator is structured to be in resonance with one or more modes of the magnetic field;
an antenna circuit communicatively coupled to the magnetic antenna structure to receive an antenna signal from the magnetic antenna structure associated with the received and concentrated magnetic field of the radio frequency or microwave signal locally in or near the magnetic antenna structure and to supply an output antenna signal to the magnetic antenna structure for transmission;
an electrically conductive structure including a surface as a conducting ground plane for the antenna device, wherein the magnetic antenna structure is positioned over the conducting ground plane; and
wherein the antenna circuit includes a conductive loop that includes a loop segment to enclose a part of the magnetic antenna structure with respect to the conducting ground plane so that the part of the magnetic antenna structure is between the conducting ground plane and the loop segment.

14. The antenna device as in claim 13, wherein one antenna segment includes a spatially uniform profile along the length of the magnetic antenna structure.

15. The antenna device as in claim 13, wherein one antenna segment at or near the resonator includes a tapered region that varies spatially from one location to another location at one end of the antenna segment where the resonator is located.

16. A magnetic antenna device, comprising:
a magnetic antenna structure that is ferromagnetic and interacts with a radio frequency or microwave signal to receive and concentrate a magnetic field of the radio frequency or microwave signal locally in or near the magnetic antenna structure, the magnetic antenna structure configured to include different antenna segments arranged lengthwise along a length of the magnetic antenna structure;
a resonator located at or near a region between the antenna segments and coupled to exchange magnetic energy with the magnetic structure, wherein the resonator is structured to be in resonance with one or more modes of the magnetic field;
an antenna circuit communicatively coupled to the magnetic antenna structure to receive an antenna signal from the magnetic antenna structure associated with the received and concentrated magnetic field of the radio frequency or microwave signal locally in or near the magnetic antenna structure and to supply an output antenna signal to the magnetic antenna structure for transmission; and an antenna receiver circuit as part of the antenna circuit, the antenna receiver circuit including a magnetoresistive (MR) sensor circuit located relative to the magnetic antenna structure to be either magnetically coupled to the magnetic antenna structure or within an electromagnetic field caused by a received radio frequency or microwave signal, wherein the MR sensor circuit exhibits an MR effect and an associated variable resistance to sense a magnetic field of the electromagnetic field caused by the received radio frequency or microwave signal to produce an MR sensor signal that carries information in the received radio frequency or microwave signal.

17. The antenna device as in claim 16, wherein one antenna segment includes a spatially uniform profile along the length of the magnetic antenna structure.

18. The antenna device as in claim 16, wherein one antenna segment at or near the resonator includes a tapered region that varies spatially from one location to another location at one end of the antenna segment where the resonator is located.

19. A magnetic antenna device, comprising:
a magnetic antenna structure that is ferromagnetic and interacts with a radio frequency or microwave signal to receive and concentrate a magnetic field of the radio frequency or microwave signal locally in or near the magnetic antenna structure, the magnetic antenna structure configured to include different antenna segments arranged lengthwise along a length of the magnetic antenna structure;
a resonator located at or near a region between the antenna segments and coupled to exchange magnetic energy with the magnetic structure, wherein the resonator is structured to be in resonance with one or more modes of the magnetic field;
an antenna circuit communicatively coupled to the magnetic antenna structure to receive an antenna signal from the magnetic antenna structure associated with the received and concentrated magnetic field of the radio frequency or microwave signal locally in or near the magnetic antenna structure and to supply an output antenna signal to the magnetic antenna structure for transmission;
a magnetic sensing structure coupled to the magnetic antenna structure to be within the electromagnetic field caused by the received radio frequency or microwave signal, wherein the magnetic sensing structure located in between the antenna segments exhibits an optical effect that varies with the electromagnetic field to cause optical modulation;
a light source that emits probe light that is directed to the magnetic sensing structure so that the magnetic sensing structure interacts with the probe light to produce modulated probe light due to the optical effect and the presence of the received radio frequency or microwave signal, the modulated probe light carrying information in the received radio frequency or microwave signal; and
an optical detection module located to receive the modulated probe light and to convert the modulated probe light into a detection signal that carries the information in the received radio frequency or microwave signal.

20. The antenna device as in claim 19, wherein:
the magnetic sensing structure exhibits a magneto-optical or electro-optic effect.

21. The antenna device as in claim 19, wherein one antenna segment includes a spatially uniform profile along the length of the magnetic antenna structure.

22. The antenna device as in claim 19, wherein one antenna segment at or near the resonator includes a tapered region that varies spatially from one location to another location at one end of the antenna segment where the resonator is located.

23. A magnetic antenna device, comprising:
a magnetic antenna structure that is ferromagnetic and interacts with a radio frequency or microwave signal to receive and concentrate a magnetic field of the radio frequency or microwave signal locally in or near the magnetic antenna structure, the magnetic antenna structure configured to include different antenna segments arranged lengthwise along a length of the magnetic antenna structure;
a resonator located at or near a region between the antenna segments and coupled to exchange magnetic energy with the magnetic structure, wherein the resonator is structured to be in resonance with one or more modes of the magnetic field;
an antenna circuit communicatively coupled to the magnetic antenna structure to receive an antenna signal from the magnetic antenna structure associated with the received and concentrated magnetic field of the radio frequency or microwave signal locally in or near the magnetic antenna structure and to supply an output antenna signal to the magnetic antenna structure for transmission;
a magnetic bias generator that generates a DC magnetic field at the magnetic antenna structure to cause a change in a permeability in the magnetic antenna structure which in turn changes an antenna property associated with the permeability; and
a tuning control module communicatively coupled to the magnetic bias generator to adjust the DC magnetic field in tuning the permeability and the associated antenna property of the magnetic antenna structure.

24. The antenna device as in claim 23, wherein one antenna segment includes a spatially uniform profile along the length of the magnetic antenna structure.

25. The antenna device as in claim 23, wherein one antenna segment at or near the resonator includes a tapered region that varies spatially from one location to another location at one end of the antenna segment where the resonator is located.

26. A method for operating a magnetic antenna device, comprising:
providing a magnetic antenna structure in the magnetic antenna device to gain an advantage from the magnetic antenna structure in operating the magnetic antenna device, the magnetic antenna structure is ferromagnetic and includes different antenna segments arranged lengthwise along a length of the magnetic antenna structure, wherein each of two antenna segments include a tapered region that varies spatially from one location to another location at one end of each antenna segment, the tapered region of one antenna segment located across from another tapered region of another antenna segment;

operating the magnetic antenna device to radiate or receive a radio frequency or microwave signal via the magnetic antenna structure, the magnetic antenna device including a resonator located at or near a region between the antenna segments and coupled to exchange magnetic energy with the magnetic structure, wherein the resonator is in resonance with one or more modes of the magnetic field; and in receiving a radio frequency or microwave signal, operating the magnetic antenna structure to concentrate a magnetic field of the received radio frequency or microwave signal locally in or near the magnetic antenna structure, and using the locally concentrated magnetic field to extract information from the received radio frequency or microwave signal.

27. The method as in claim 26, comprising:

placing the magnetic antenna structure over an electrically conductive structure that includes a surface as a conducting ground plane for the magnetic antenna device in transmitting or receiving the radio frequency or microwave signal.

28. The method as in claim 26, comprising:

applying a DC magnetic field at the magnetic antenna structure to cause a change in a permeability in the magnetic antenna structure so as to change an antenna property associated with the permeability; and adjusting the applied DC magnetic field to tune the permeability and the associated antenna property of the magnetic antenna structure in order to adjust an operation of the antenna device.

29. The method as in claim 28, wherein the applied DC magnetic field is adjusted to change a gain of the antenna device.

30. The method as in claim 28, wherein the applied DC magnetic field is adjusted to change a frequency bandwidth of the antenna device.

31. The method as in claim 28, wherein the applied DC magnetic field is adjusted to change an impedance of the antenna device.

32. The method as in claim 28, wherein the applied DC magnetic field is adjusted to change an antenna voltage standing wave ratio (VSWR) or standing wave ratio (SWR) of the antenna device.

33. The method as in claim 26, comprising:

coupling a magnetoresistive (MR) sensor circuit to the magnetic antenna structure to be within an electromagnetic field caused by a received radio frequency or microwave signal or to be magnetically coupled to the magnetic antenna structure;

operating the MR sensor circuit to sense a magnetic field of the electromagnetic field caused by the received radio frequency or microwave signal or the magnetization of the magnetic antenna structure that is modulated by the received radio frequency or microwave signal to produce an MR sensor signal that carries the information in the received radio frequency or microwave signal; and processing the MR sensor signal to extract the information in the received radio frequency or microwave signal.

34. The method as in claim 26, comprising:

using the received radio frequency or microwave signal by the magnetic antenna to cause optical modulation of probe light to produce modulated probe light carrying information in the received radio frequency or microwave signal; and operating an optical detection module and to convert the modulated probe light into a detection signal that carries the information in the received radio frequency or microwave signal.

35. A method for operating a magnetic antenna device, comprising:

providing a magnetic antenna structure in the magnetic antenna device to gain an advantage from the magnetic antenna structure in operating the magnetic antenna device, the magnetic antenna structure is ferromagnetic and includes different antenna segments arranged lengthwise along a length of the magnetic antenna structure;

operating the magnetic antenna device to radiate or receive a radio frequency or microwave signal via the magnetic antenna structure, the magnetic antenna device including a resonator located at or near a region between the antenna segments and coupled to exchange magnetic energy with the magnetic structure, wherein the resonator is in resonance with one or more modes of the magnetic field;

in receiving a radio frequency or microwave signal, operating the magnetic antenna structure to concentrate a magnetic field of the received radio frequency or microwave signal locally in or near the magnetic antenna structure, and using the locally concentrated magnetic field to extract information from the received radio frequency or microwave signal;

coupling a magnetoresistive (MR) sensor circuit to the magnetic antenna structure to be within an electromagnetic field caused by a received radio frequency or microwave signal or to be magnetically coupled to the magnetic antenna structure;

operating the MR sensor circuit to sense a magnetic field of the electromagnetic field caused by the received radio frequency or microwave signal or the magnetization of the magnetic antenna structure that is modulated by the received radio frequency or microwave signal to produce an MR sensor signal that carries the information in the received radio frequency or microwave signal; and processing the MR sensor signal to extract the information in the received radio frequency or microwave signal.

36. A method for operating a magnetic antenna device, comprising:

providing a magnetic antenna structure in the magnetic antenna device to gain an advantage from the magnetic antenna structure in operating the magnetic antenna device, the magnetic antenna structure is ferromagnetic and includes different antenna segments arranged lengthwise along a length of the magnetic antenna structure;

operating the magnetic antenna device to radiate or receive a radio frequency or microwave signal via the magnetic antenna structure, the magnetic antenna device including a resonator located at or near a region between the antenna segments and coupled to exchange magnetic energy with the magnetic structure, wherein the resonator is in resonance with one or more modes of the magnetic field;

in receiving a radio frequency or microwave signal, operating the magnetic antenna structure to concentrate a magnetic field of the received radio frequency or microwave signal locally in or near the magnetic antenna structure, and using the locally concentrated magnetic field to extract information from the received radio frequency or microwave signal;

using the received radio frequency or microwave signal by the magnetic antenna to cause optical modulation of probe light to produce modulated probe light carrying information in the received radio frequency or microwave signal; and operating an optical detection module and to convert the modulated probe light into a detection signal that carries the information in the received radio frequency or microwave signal.

\* \* \* \* \*